United States Patent
Haisler et al.

(10) Patent No.: US 9,398,701 B2
(45) Date of Patent: Jul. 19, 2016

(54) COMPONENT HOLDING STRUCTURES, SYSTEM, AND METHOD

(71) Applicant: General Electric Company, Schenectady, NY (US)

(72) Inventors: Mark Alan Haisler, Allen, TX (US); Rick Lee Barnett, Dallas, TX (US); William L. Woods, Jr., Kaufman, TX (US); James Edward Harvey, Heath, TX (US)

(73) Assignee: General Electric Company, Schenectady, NY (US)

( * ) Notice: Subject to any disclaimer, the term of this patent is extended or adjusted under 35 U.S.C. 154(b) by 234 days.

(21) Appl. No.: 14/061,250

(22) Filed: Oct. 23, 2013

(65) Prior Publication Data

US 2014/0268608 A1    Sep. 18, 2014

Related U.S. Application Data

(60) Provisional application No. 61/784,551, filed on Mar. 14, 2013.

(51) Int. Cl.
    *H05K 3/30*    (2006.01)

(52) U.S. Cl.
    CPC ............... *H05K 3/301* (2013.01); *H05K 3/306* (2013.01); *H05K 2201/10515* (2013.01); *H05K 2201/10606* (2013.01); *Y10T 29/49139* (2015.01)

(58) Field of Classification Search
    CPC ......... H05K 3/301; H05K 3/303; H05K 3/30; H05K 3/306
    USPC ........ 361/679.04, 679.38, 727, 752, 756, 761
    See application file for complete search history.

(56) References Cited

U.S. PATENT DOCUMENTS

| | | | | |
|---|---|---|---|---|
| 3,434,079 A | * | 3/1969 | Ege, Jr. ................. | H01H 51/281 335/151 |
| 3,962,719 A | * | 6/1976 | Pfaff .................... | H05K 7/1053 174/138 G |
| 4,968,962 A | * | 11/1990 | Hohider et al. .................. | 337/4 |
| 6,612,525 B2 | | 9/2003 | Bagdi | |

OTHER PUBLICATIONS

Blaha, Battery Holders Being Designed for Your Design, 2011, 3 pages, Memory Protection Devices, Inc., batteryholders.com, http://medicaldesign.com/engineering-prototyping/hardware-access/battery-holders-design-1013/.

Stacked Fuse Part Found in an Eltek Power Supply, Fabricated in Shenzen China, photos taken 2013.

* cited by examiner

*Primary Examiner* — Jenny L Wagner
*Assistant Examiner* — Jessey R Ervin
(74) *Attorney, Agent, or Firm* — General Electric Company

(57) ABSTRACT

A component holding structure for holding a plurality of through-hole components having an axial lead includes a pair of opposing end walls that define a cavity between them. The cavity is configured to receive the through-hole components. The through-hole components are positioned between the pair of opposing end walls in a vertically-stacked configuration. Each one of the end walls includes at least one slot that is configured to receive the axial lead of each through-hole component when the plurality of through-hole components are inserted into the component holding structure. Each one of the end walls also includes a plurality of lead guides that are configured to guide the axial lead of each through-hole component when the plurality of through-hole components are inserted into the component holding structure.

20 Claims, 32 Drawing Sheets

SECTION A-A

SECTION C-C

SECTION E-E

COMPONENT HOLDING STRUCTURES, SYSTEM, AND METHOD

CROSS REFERENCE TO RELATED APPLICATIONS

This application claims the benefit of U.S. Provisional Patent Application No. 61/784,551 filed Mar. 14, 2013, which is hereby incorporated by reference in its entirety.

BACKGROUND

The subject matter disclosed herein relates generally to mounting electronic components and, more particularly, to apparatus and systems for mounting multiple electronic components to a printed wiring board.

Many known electronic devices have printed circuit assemblies (PCAs) that include one or more printed wiring boards (PWBs) or printed circuit boards (PCBs) with a plurality of electronic components attached to the PWBs or PCBs. For example, PCAs are used in computers, power supplies, inverters, and many other types of electronic devices. Traditional placement of large axial through-hole components, e.g., resistors, fuses, and the like, can occupy significant planar PCB space, while wasting Z-direction space. One way to reduce wasted z-direction space is to stack the components, thereby reducing the usage X-Y space. This method, however, requires hand soldering the components when they are to be stacked individually.

When multiple components are hand stacked and soldered, the mechanical integrity of the assembly may be compromised. In some known electronic devices, the stacked components require the use of secondary mechanical support, such as the use of adhesives. The hand-stacked components must be able to withstand physical abuse while remaining electrically isolated from each other.

BRIEF DESCRIPTION

In one aspect, a component holding structure is provided. The component holding structure includes a pair of opposing end walls that define at least one cavity therebetween. The at least one cavity is configured to receive a plurality of through-hole components therein. The plurality of through-hole components are positioned between the pair of opposing end walls in a vertically-stacked configuration. Each one of the through-hole components has an axial lead. Each one of the end walls includes at least one slot defined therethrough. The at least one slot is configured to receive the axial lead of each through-hole component when the plurality of through-hole components are inserted into the component holding structure. Furthermore, each one of the end walls includes a plurality of lead guides that are configured to guide the axial lead of each through-hole component when the plurality of through-hole components are inserted into the component holding structure.

In another aspect, a power electronics system is provided. The power electronics system includes a printed circuit board and a plurality of through-hole components. Each of the through-hole components includes an axial lead. In addition, the system includes a component holding structure coupled to the printed circuit board. The component holding structure includes a pair of opposing end walls that define at least one cavity therebetween. The plurality of through-hole components are positioned between the pair of opposing end walls in a vertically-stacked configuration. Each one of the end walls includes at least one slot defined therethrough. The at least one slot is configured to receive the axial lead of each through-hole component. Furthermore, each one of the end walls includes a plurality of lead guides that are configured to receive and to guide the axial lead of each through-hole component towards the printed circuit board.

In another aspect, a method of assembling a power electronics system is provided. The method includes providing a component holding structure that includes a pair of opposing end walls that define at least one cavity therebetween. Each end wall includes at least one slot defined therethrough and a plurality of lead guides. The method also includes inserting a plurality of through-hole components having an axial lead into the component holding structure such that the plurality of through-hole components are positioned in a vertically-stacked configuration. The method further includes inserting the axial leads into the at least one slot, guiding the axial leads using the plurality of lead guides, and trimming the axial leads to a desired length. Furthermore, the method includes coupling the component holding structure to a printed circuit board by soldering the axial leads to the printed circuit board.

DRAWINGS

Although specific features of various embodiments may be shown in some drawings and not in others, this is for convenience only. Any feature of any drawing may be referenced and/or claimed in combination with any feature of any other drawing.

DETAILED DESCRIPTION

The electronics industry is a competitive industry and it is desirable to reduce costs associated with assembling and shipping electronic devices. Stacking electronic components can facilitate reducing the space needed for PCBs, however, the assembly costs can increase prohibitively with the need for hand stacking and soldering. A holding structure for securing axial through-hole components can provide improved manufacturing efficiency while simultaneously providing structural integrity to the vertically-stacked components.

Figure 3:
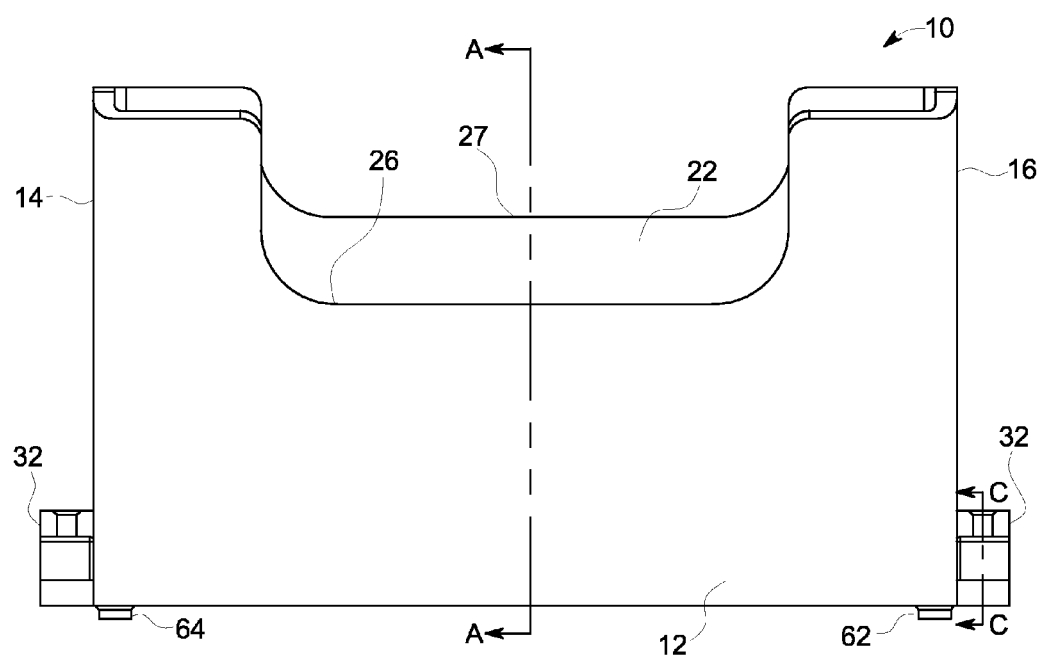
FIG. 3 is a front view of the component holding structure of FIG. 1.
Figure 4:
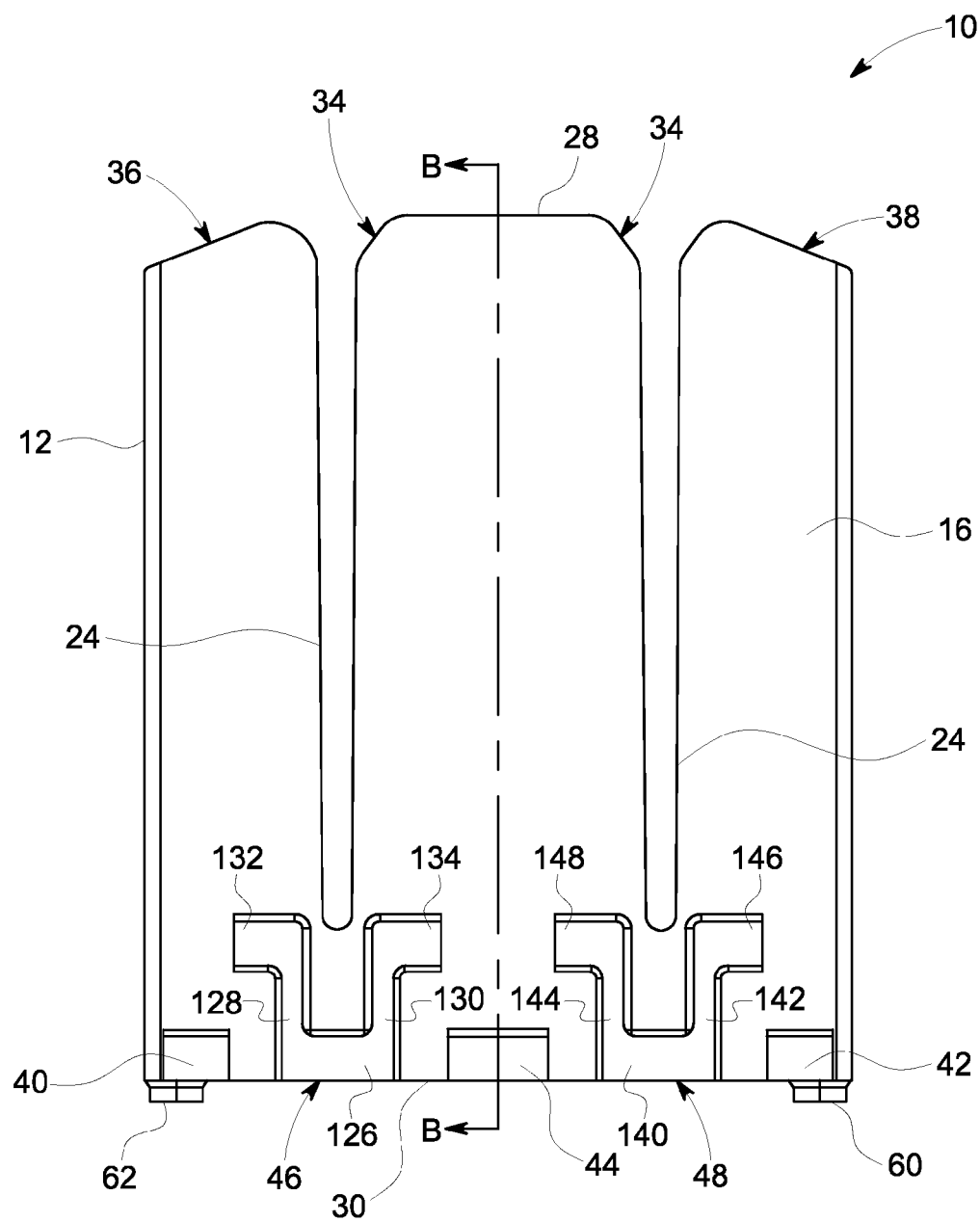
FIG. 4 is an end view of the component holding structure of FIG. 1.
Figure 5:
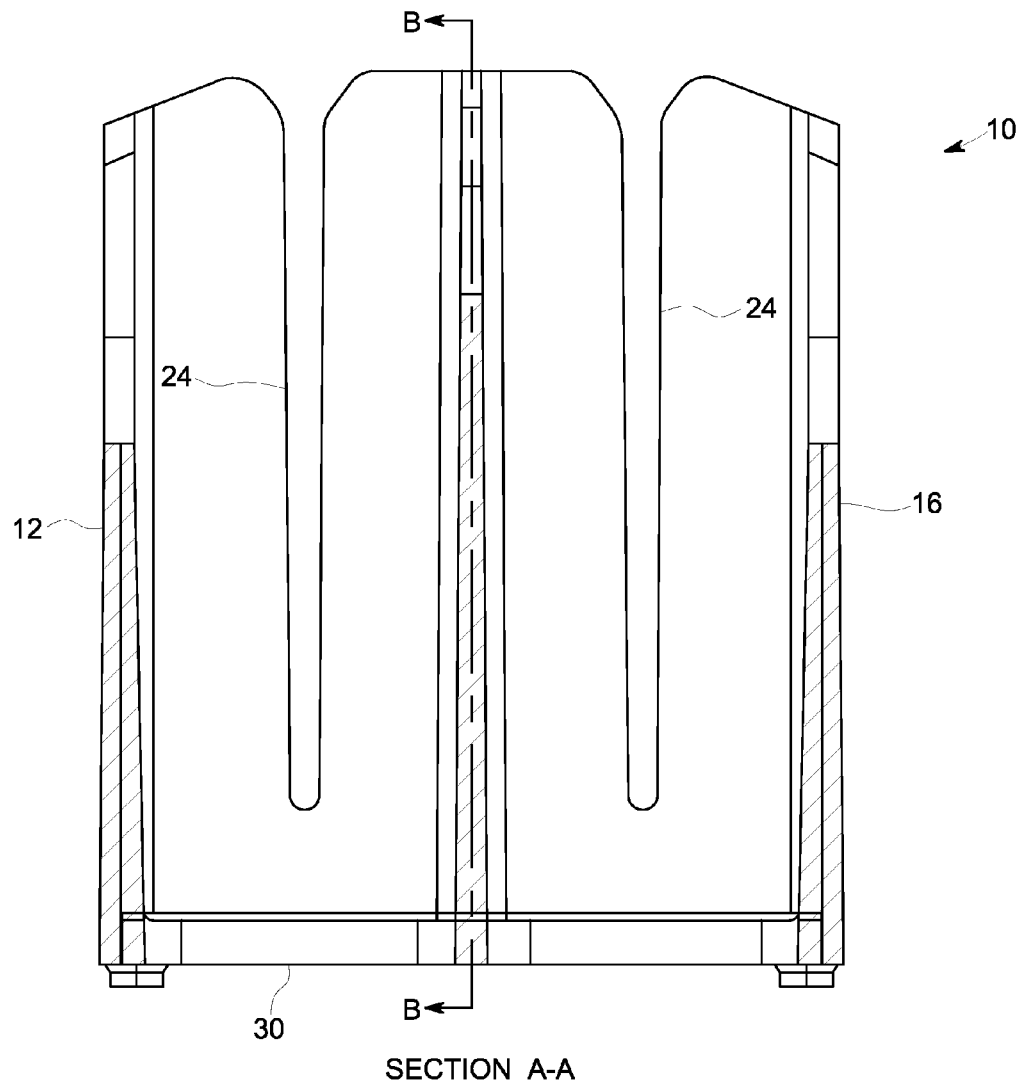
FIG. 5 is a cross section view of the component holding structure of FIG. 1 taken about line A.

As shown in FIGS. 1-7, an exemplary axial through-hole component holding structure 10 is configured to hold multiple axial lead components 100 or other such electronic components with axial leads. As shown in FIG. 3, the exemplary component holding structure 10 is substantially symmetrical with respect to a vertical line A, which, when viewed from the front, is substantially centered on component holding structure 10. In addition, as shown in FIG. 4, the exemplary component holding structure 10 is substantially symmetrical with respect to a vertical line B, which, when viewed from an end, is substantially centered on component holding structure 10. Alternatively, component holding structure 10 may include features and/or elements that are not symmetrical with respect to each other. The terms top, bottom, front, rear, left, and right are used only for convenience to indicate relative positional relationships The exemplary component holding structure 10 is a molded container 11 that is substantially cuboid in shape. Accordingly, the features of component holding structure 10 described herein may have a draft angle associated with each wall and/or cavity to promote removal of component holding structure 10 from a mold. Component holding structure 10 is fabricated by injection molding a thermoplastic synthetic resin suitable for use as an insulator in electrical and electronic devices. In the exemplary embodiment, component holding structure 10 is fabricated from polybutylene terephthalate (PBT). However, component holding structure 10 may be fabricated from any non-conductive material that permits component holding structure 10 to function as described herein. Furthermore, component holding structure 10 may be fabricated by methods other than molding, e.g., machining, and therefore may not have a draft angle associated with the features as described herein.

Component holding structure 10 is a cuboid-shaped structure that broadly includes a front wall 12, a rear wall 18, a left end wall 14, and an opposing right end wall 16. In the exemplary embodiment, component holding structure 10 also includes a center divider 22 substantially centered on line B and running substantially parallel to front wall 12 and rear wall 18. A front cavity 20, which is open to the top 28 and extends down to the bottom wall 30 of component holding structure 10, is formed by the inner sides of front wall 12, left end wall 14, right end wall 16, and bottom wall 30, and by the front side of divider 22. In the exemplary embodiment, component holding structure 10 includes a rear cavity 21 that is substantially symmetrical to front cavity 20 with respect to line B. Alternatively, component holding structure 10 may include any number of cavities and dividers that permit component holding structure 10 to function as described herein.

Front wall 12 and rear wall 18 include wide, vertically extending rectangular-shaped cutouts 26 formed therethrough. Cutouts 26 are provided in positions that are symmetric to each other in relation to line B. Cutouts 26 are open to the top 28 of component holding structure 10 and extend down a distance that is between approximately 20% and approximately 50% of the height of the respective wall. Cutouts 26 are generally centered on a respective wall in relation to line A, and extend widthwise between approximately 50% and 75% of the width of the respective wall. Alternatively, cutouts 26 may be of varying widths and depths that permit component holding structure 10 to function as described herein. In addition, divider 22 includes a wide, vertically extending rectangular-shaped cutout 27 formed therethrough. Cutout 27 is open to the top 28 of component holding structure 10 and extends down a distance that is between approximately 20% and approximately 50% of the height of divider 22. Cutout 27 is generally centered on divider 22 in relation to line A, and extends widthwise between approximately 50% and 75% of the width of divider 22. In the exemplary embodiment, cutouts 26 and cutout 27 are substantially the same width. Alternatively, the widths of cutouts 26 and cutout 27 can be any width that permits component holding structure 10 to function described herein. Cutouts 26 and cutout 27 facilitate the fabrication process by limiting the amount of material used during the molding process and facilitate the insertion and removal of axial lead components 100 from component holding structure 10.

Figure 9:
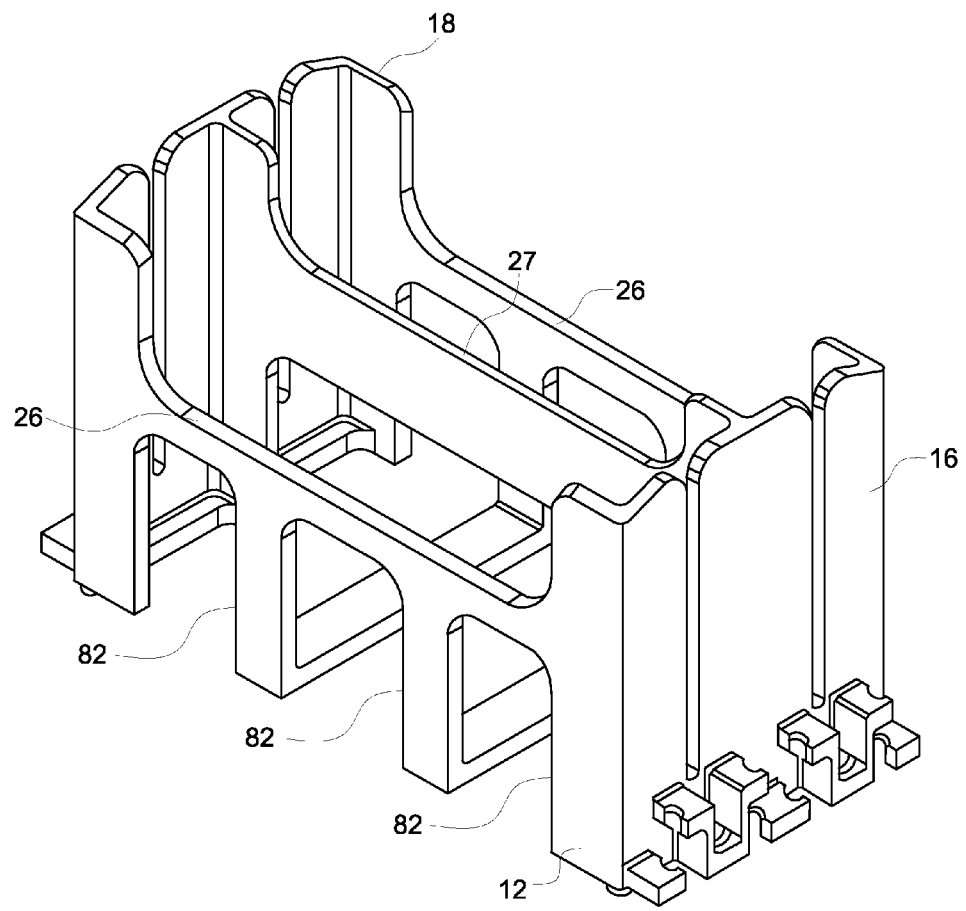
FIG. 9 is a schematic perspective view of an another alternative embodiment of the component holding structure of FIG. 1 as seen from the top.
Figure 10:
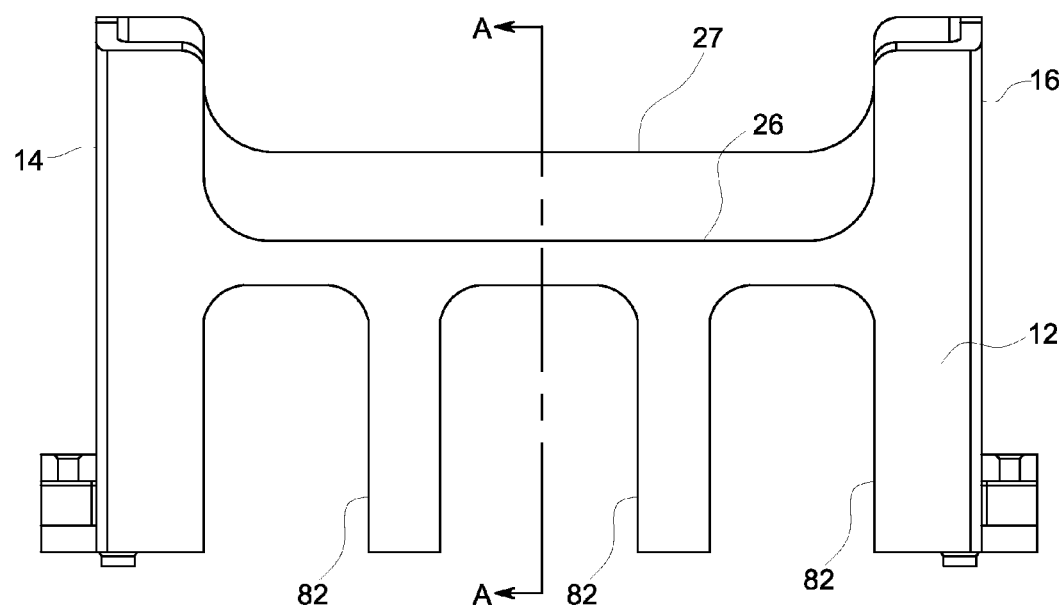
FIG. 10 is a front view of the component holding structure of FIG. 9.

In an alternative embodiment shown in FIGS. 9 and 10, front wall 12, rear wall 18, and divider 22 may include a plurality of vent slots 82 in addition to cutouts 26 and 27. As shown in FIGS. 9 and 10, front wall 12 and rear wall 18 may include vent slots 82 formed therethrough. Vent slots 82 may be spaced apart between end wall 16 and 18 and generally of uniform width. As illustrated, there may be three vent slots 82. The two outer vent slots 82 are provided in positions that are symmetric to each other in reference to line A. The center vent slot 82 is generally centered about line A. The outer edges of the two outermost vent slots 82 are generally aligned with a respective outer edge of cutouts 26 and 27. Vent slots 82 are configured to extend height wise such that an upper edge of vent slot 82 is spaced apart from a lower edge of cutout 26. The vent slots 82 are open to the bottom. Alternatively, vent slots 82 may be of varying widths and heights that permit component holding structure 10 to function as described herein. Alternatively, center divider 22 may have the vertical separators for the three vent slots 82 removed.

In the exemplary embodiment of FIGS. 1-7, each end wall 14 and 16 of component holding structure 10 includes elongate, vertically extending slots 24 formed therethrough. In the exemplary embodiment, slots 24 in left end wall 14 and slots 24 in right end wall 16 are provided in positions that are substantially symmetric to each other in relation to line A. Further, slots 24 on a respective end wall are spaced laterally apart and are provided in positions that are symmetric to each other in relation to line B, generally being substantially centered relative to cavities 20 and 21. Alternatively, slots 24 may not be symmetric to each other and may be of varying lengths with some slots 24 being longer than others. In the exemplary embodiment, slots 24 are open at the top 28 of component holding structure 10 and extend down to a location generally adjacent the top portion of the lead guides, which are generally indicated at 32. In an alternative embodiment, slots 24 extend down to a location that is spaced above the top portion of lead guides 32. The width of slots 24 is configured such that a standard diameter lead of axial lead component 100 can freely slide through slot 24. In the exemplary embodiment, slots 24 have a width in the range of about 0.5 millimeters (mm) (0.020 inches (in.)) to about 1.0 mm (0.040 in). Alternatively, slots 24 may have any width that permits component holding structure 10 to function as described herein.

In the exemplary embodiment, right end wall 16 and left end wall 14 are shaped to facilitate insertion of axial lead components 100 from component holding structure 10. Referring to FIG. 4, the open top of slots 24 taper outward, away from the slot, to create funnel-shaped openings 34. In addition, the front upper portion of right end wall 16 and left end wall 14 are rounded or tapered downward between an edge of funnel-shaped opening 34 and front wall 12, defining a tapered area 36. In the exemplary embodiment, tapered area 36 is configured such that the edge of tapered area 36 is approximately equidistant from a point defined by the intersection of line B and the bottom edge of the respective end wall. In addition, the rear upper portion of right end wall 16 and left end wall 14 includes a tapered area 38 that is substantially symmetric in relation to line B. Tapered areas 36 and 38 are formed to facilitate rolling axial lead components 100 into place during assembly. Alternatively, tapered areas 36 and 38 may be defined in any configuration that permits component holding structure 10 to function as described herein.

Figure 7:
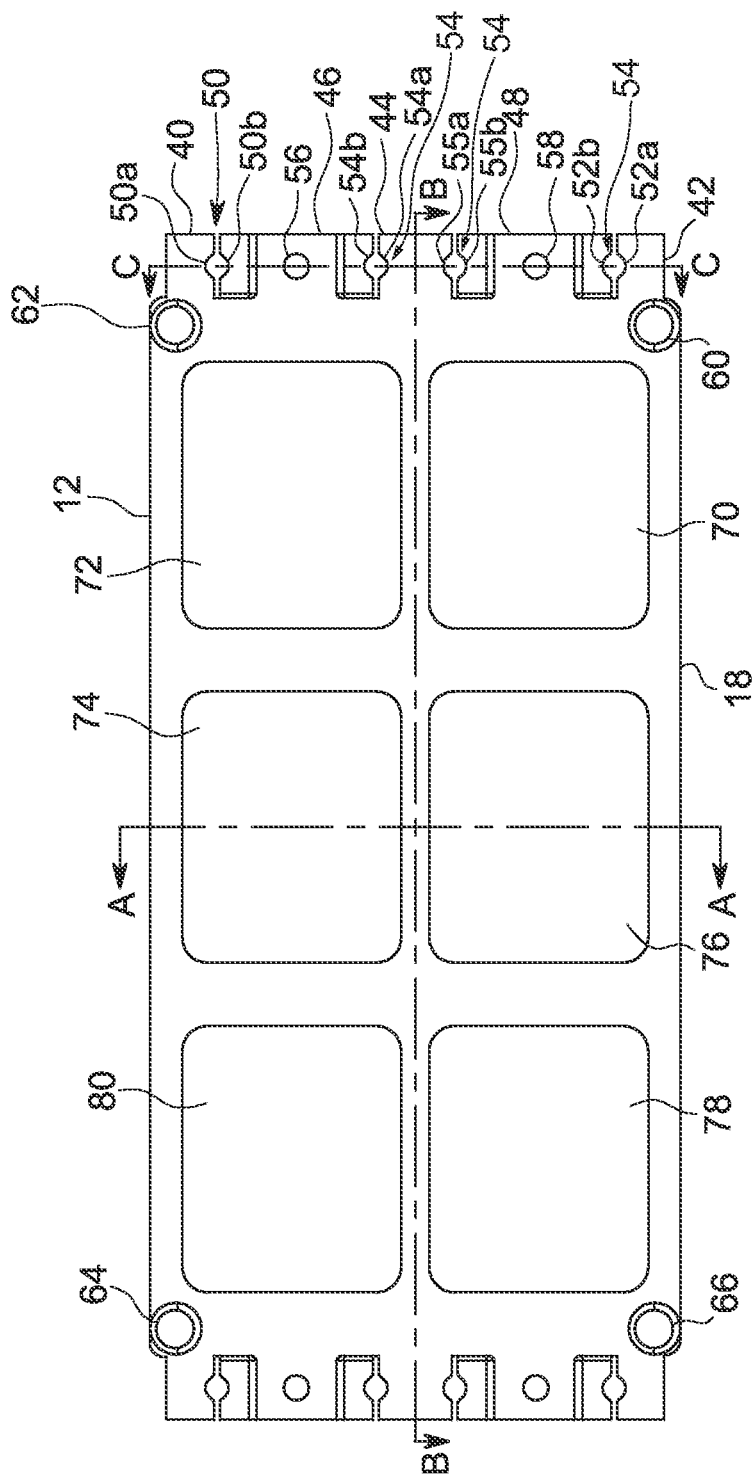
FIG. 7 is a bottom view of the component holding structure of FIG. 1.

In the exemplary embodiment, lead guides 32 are provided on right end wall 16 and left end wall 14 in positions that are substantially symmetric in reference to line A. Referring to FIG. 4, rectangular-shaped lower guides 40 and 42 are provided in positions that are substantially symmetric in reference to line B, and rectangular-shaped lower guide 44 is provided substantially centered on line B. In addition, a bottom surface of lower guides 40, 42, and 44 is coplanar with bottom wall 30. Top surfaces of lower guides 40, 42, and 44 are spaced upward from bottom wall 30 a predetermined distance and are substantially coplanar with each other. Further, U-shaped upper guides 46 and 48 are spaced laterally apart and are provided in positions that are symmetric to each other in relation to line B, generally being substantially centered relative to slots 24, and a lower surface of upper guides 46 and 48 being coplanar with bottom wall 30. With reference to FIG. 7, it is shown that lower guides 40, 42, and 44, and upper guides 46 and 48 are spaced laterally apart from each other such that they do not overlap when viewed from below, and that each guide extends substantially the same distance away from right end wall 16.

Referring back to FIG. 4, lower guide 40 includes a semicircular groove 50a formed in its rear surface about a vertical axis. The top edge of semicircular groove 50a is tapered to facilitate guiding a lead 102 of axial lead component 100 into the groove. Lower guide 42 is substantially symmetric to lower guide 40 and thus includes a semicircular groove 52a formed in its front surface, also about a vertical axis. The top edge of semicircular groove 52a is tapered to facilitate guiding lead 102 of axial lead component 100 into the groove. Centered about line B is lower guide 44. Lower guide 44 includes a first semicircular groove 54a in its front surface and a second semicircular groove 55a in its rear surface. Both first and second semicircular grooves 54a and 55a are formed about a vertical axis.

Figure 6:
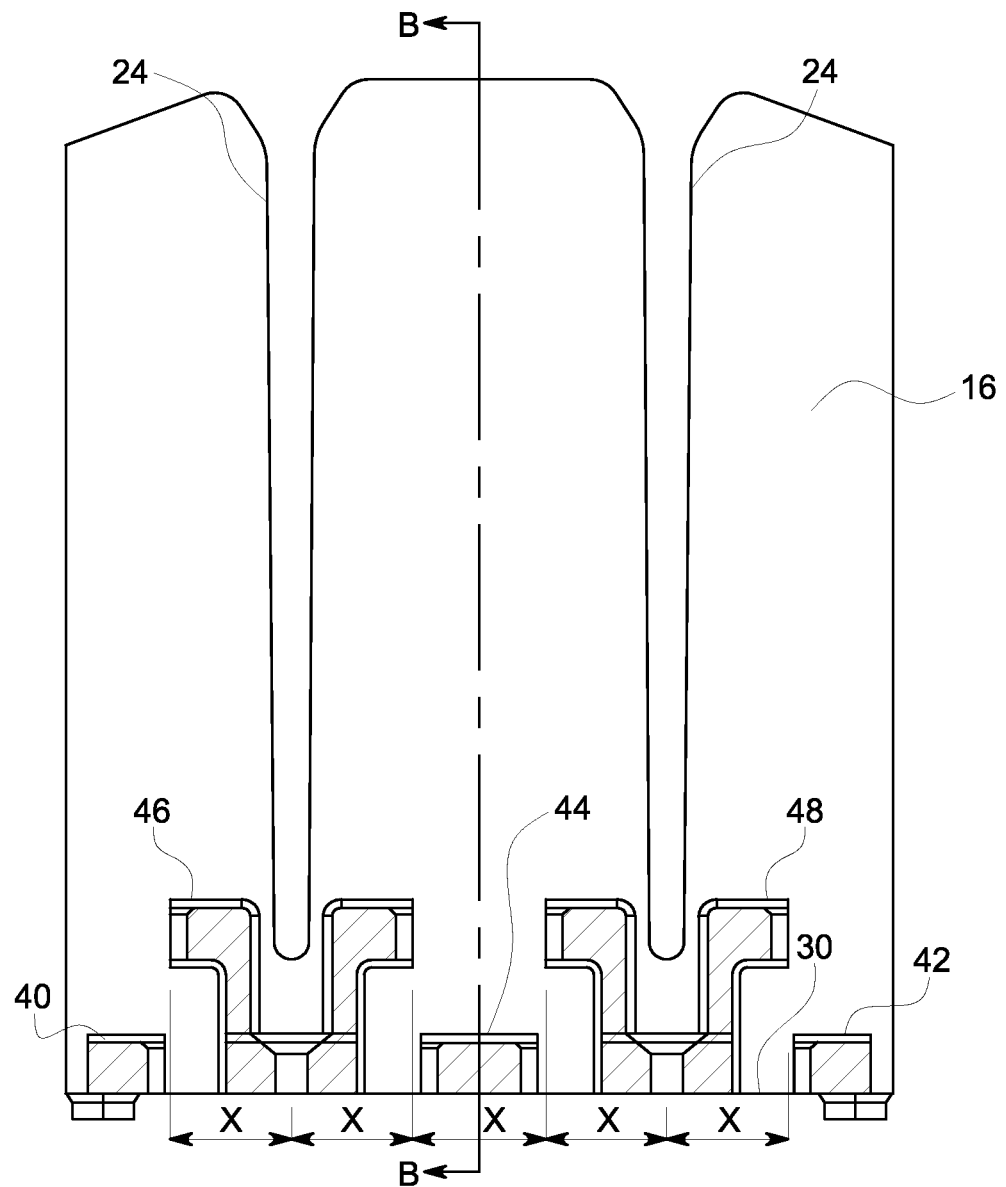
FIG. 6 is a cross section view of the component holding structure of FIG. 1 taken about section line C.
Figure 8:
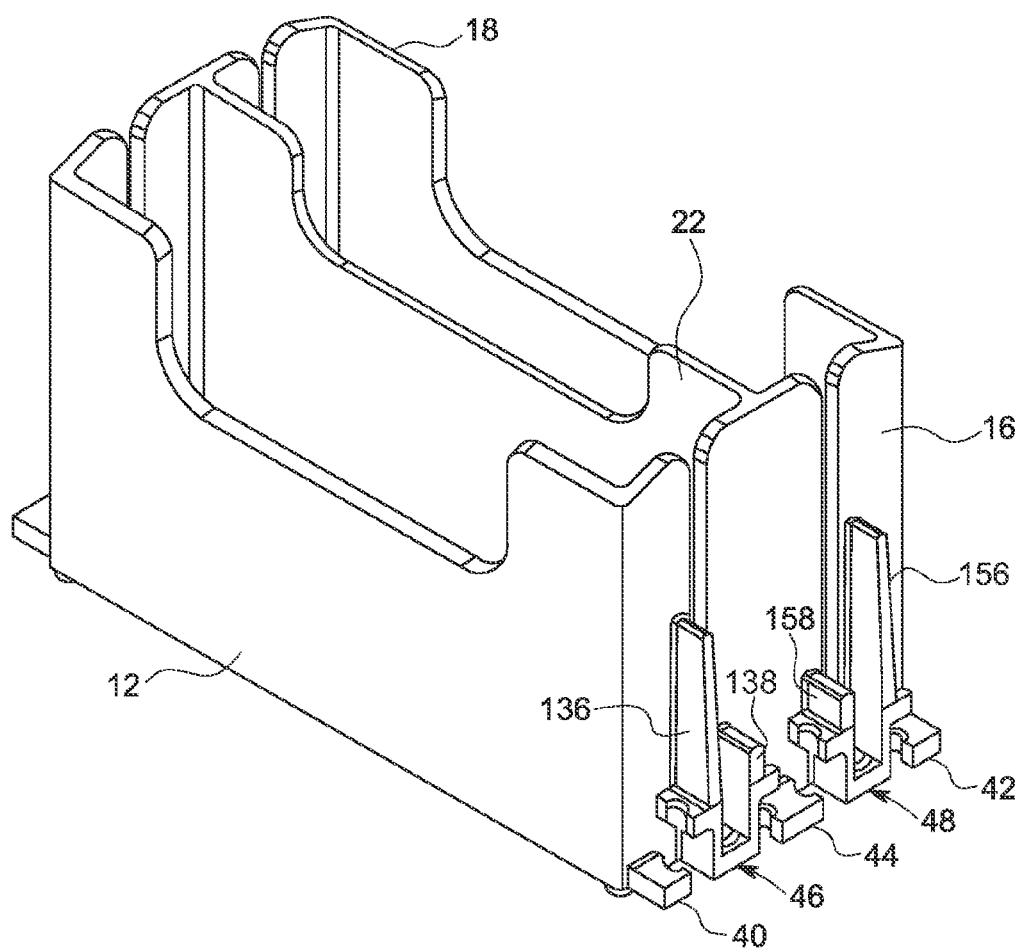
FIG. 8 is a schematic perspective view of an alternative embodiment of the component holding structure of FIG. 1 as seen from the top.

Upper guide 46 is approximately U-shaped and includes a base 126, two vertical arms 128 and 130, and two upper members 132 and 134 that extend away from base 126; each upper member 132 and 134 is attached to a respective arm 128 and 130. In the exemplary embodiment, each upper member 132 and 134 is attached to a top of a respective arm 128 and 130. Alternatively, with reference to FIG. 8, a barrier fin 136 and/or 138 may extend upward, substantially parallel to slot 24, from upper members 132 and 134 respectively a predetermined distance to facilitate spacing leads 102 apart from each other during use. In the exemplary embodiment, base 126 extends up from bottom wall 30 substantially the same distance as lower guides 40, 42, and 44. Furthermore, base 126 includes a circular hole 56 defined about a vertical axis, where the vertical axis is substantially centered with slot 24 when viewed from an end of component holding structure 10. The top edge of circular hole 56 is tapered to facilitate guiding lead 102 of axial lead component 100 through hole 56. Extending vertically up from base 126 and adjacent hole 56 and a front surface of base 126 is a first arm 128. First arm 128 is attached to a first upper member 132 that is spaced apart from base 126. First upper member 132 of upper guide 46 includes a semicircular groove 50b formed in its front surface about a vertical axis. The top edge of semicircular groove 50b is tapered to facilitate guiding lead 102 of axial lead component 100 into the groove. The vertical axis of semicircular groove 50b is collinear with the vertical axis of semicircular groove 50a of lower guide 40. As shown in FIG. 6, semicircular grooves 50a and 50b combine to define a lead slot 50 that is substantially circular when viewed from below. A second arm 130 and a second upper member 134 are positioned substantially symmetric to first arm 128 and first upper member 132 with reference to the vertical axis of hole 56 in base 126. Second upper member 134 includes a semicircular groove 54b formed in its rear surface, also about a vertical axis. The top edge of semicircular groove 54b is tapered to facilitate guiding lead 102 of axial lead component 100 into the groove. The vertical axis of semicircular groove 54b is collinear with the vertical axis of semicircular groove 54a of lower guide 44. Thus, as shown in FIG. 6, semicircular grooves 54a and 54b combine to define a lead slot 54 that is substantially circular when viewed from below. In the exemplary embodiment, the upper surfaces of the first and second upper members, 132 and 134 respectively, are substantially coplanar and are positioned approximately adjacent the bottom of slot 24. Alternatively, first upper member 132 and second upper member 134 may be spaced apart from the base by different amounts. In the exemplary embodiment, first and second upper members 132 and 134 are spaced apart from base 126 of upper guide 46 to facilitate maintaining space between leads 102 of multiple axial lead components 100.

Upper guide 48 is provided in a position substantially symmetric to upper guide 46 with reference to line B. As shown in FIG. 6, upper guide 48 includes hole 58 through base 140 and semicircular grooves 52b and 55b formed in respective upper members 146 and 148. Upper members 146 and 148 are attached to respective arms 142 and 144 that extend upward from base 140. Alternatively, with reference to FIG. 8, a barrier fin 156 and/or 158 may extend upward, substantially parallel to slot 24, from upper members 146 and 148 respectively a predetermined distance to facilitate spacing leads 102 apart from each other during use. In the exemplary embodiment, the vertical axis of semicircular groove 52b is collinear with the vertical axis of semicircular groove 52a of lower guide 42. Semicircular grooves 52a and 52b combine to define a lead slot 52 that is substantially circular when viewed from below. Further, the vertical axis of semicircular groove 55b is collinear with the vertical axis of semicircular groove 55a of lower guide 44. Thus, semicircular grooves 55a and 55b combine to define a lead slot 55 that is substantially circular when viewed from below.

With reference to FIGS. 6 and 7, it is shown that the vertical axes of lead slots 50, 52, 54, and 55, and holes 56, and 58 are aligned along a path that is parallel to line A. Further, lead slots 50, 52, 54, and 55, and holes 56, and 58 are provided at a regular pitch X and are provided in positions that are symmetric to each other in reference to line B.

In the exemplary embodiment, a plurality of bosses 60, 62, 64, and 66 are provided on bottom wall 30 of component holding structure 10. The bosses 60, 62, 64, and 66 are provided in positions that are symmetric to each other in relation to lines A and B and are generally positioned at the outer corners of bottom wall 30. Bottom wall 30 also includes a plurality of cutouts. In the exemplary embodiment, six cutouts 70, 72, 74, 76, 78, and 80 are defined through bottom wall 30. Cutouts 72, 74, and 80 open to cavity 20, and cutouts 70, 76, and 78 open to cavity 21. Cutouts 72 and 80 are provided in positions that are symmetric to each other in relation to line A. Cutout 74 is provided substantially centered about line A and spaced inward from cutouts 72 and 80. The front edges of cutouts 72, 74, and 80 are defined by the inner surface of front wall 12, and the rear edges of cutouts 72, 74, and 80 are defined by the front surface of divider 22. In the exemplary embodiment, cutouts 70, 76, and 78 are provided in positions that are substantially symmetric to cutouts 72, 74, and 80, respectively, with reference to line B. Cutouts 70, 72, 74, 76, 78, and 80 facilitate the fabrication process by limiting the amount of material used during the molding process and facilitate the removal of axial lead components 100 from component holding structure 10. In alternative embodiments, component holding structure 10 may include any number and configuration of cutouts in bottom wall 30 that permits component holding structure 10 to function as described herein.

Figure 11:
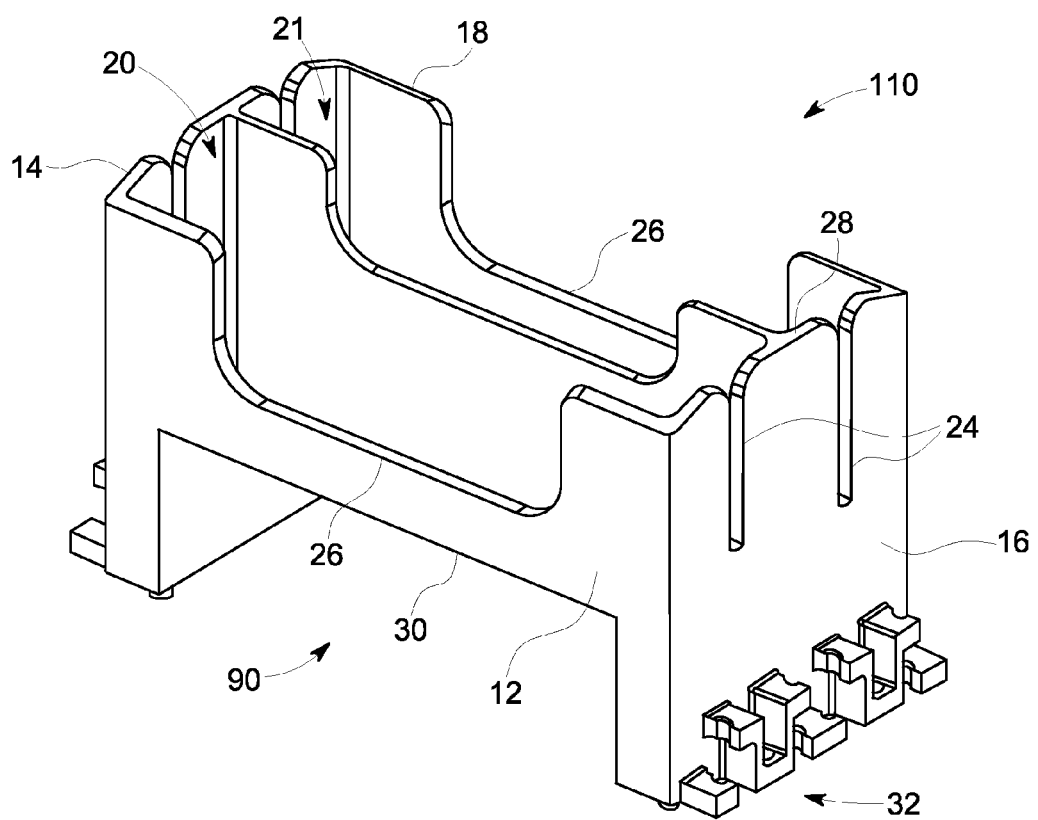
FIG. 11 is a schematic perspective view of another alternative embodiment of the component holding structure of FIG. 1 as seen from the top.

In the exemplary embodiment described in FIGS. 1-7, a bottom surface of bottom wall 30 is coincident with the bottom edges of right end wall 16 and left end wall 14. Alternatively, the bottom surface of bottom wall 30 may be spaced apart from the bottom edges of end walls 14 and 16. As shown in FIG. 11, an alternative component holding structure 110 includes bottom wall 30 spaced apart from the bottom surfaces of left end wall 14 and right end wall 16. Front wall 12 and rear wall 18 extend upward from bottom wall 30 towards the open top 28 of component holding structure 110, thereby defining an open space 90 beneath bottom wall 30 and between end walls 14 and 16. Open space 90 facilitates efficient use of printed circuit board (PCB) space by permitting surface mount components and/or small through-hole components to be placed beneath component holding structure 110.

Figure 1:
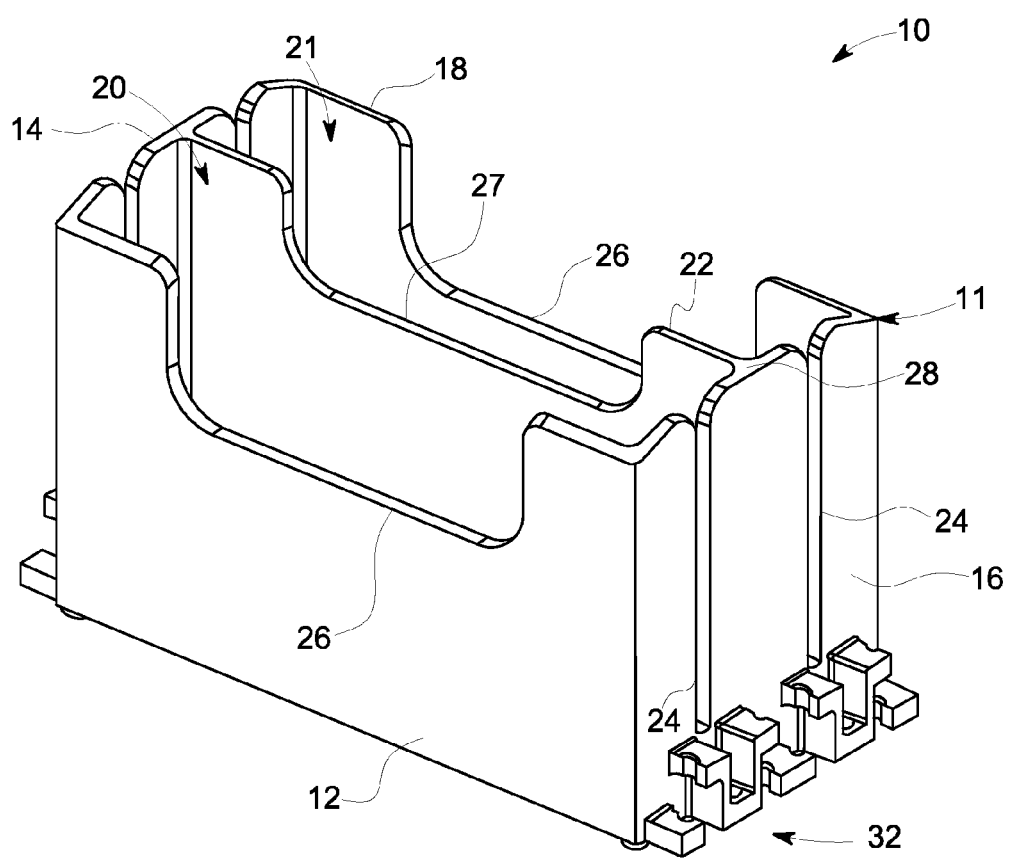
FIG. 1 is a schematic perspective view of an exemplary component holding structure as seen from the top.
Figure 2:
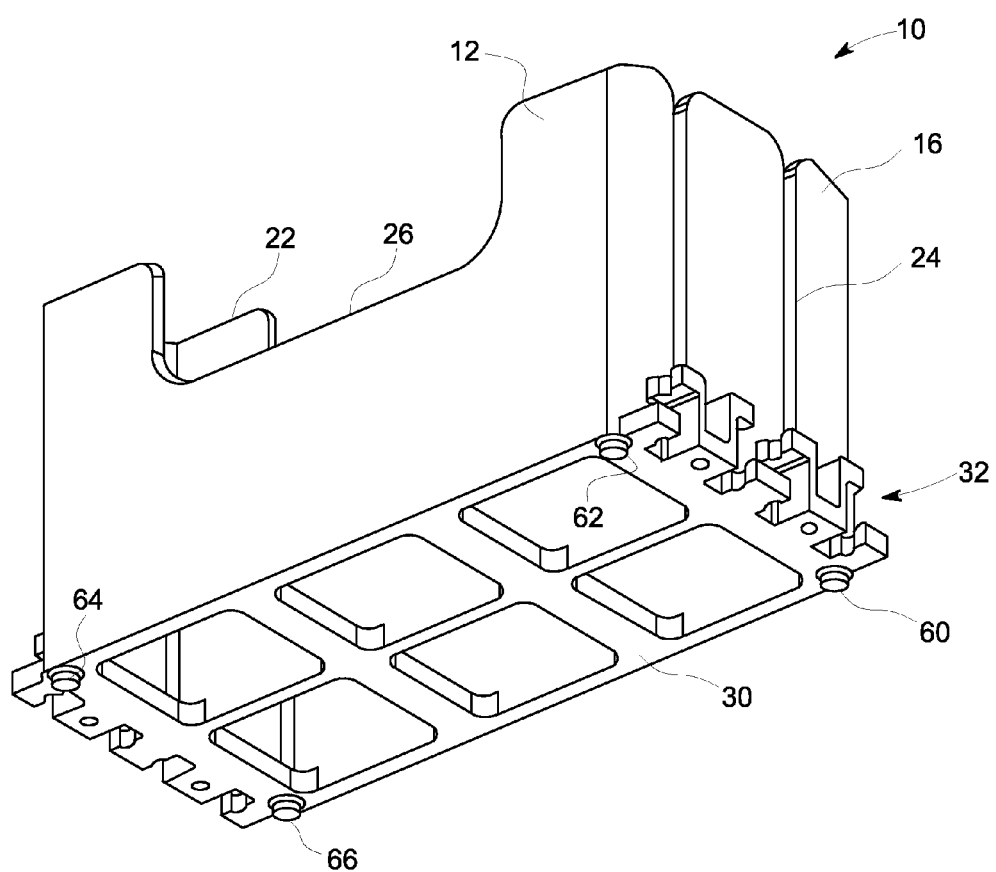
FIG. 2 is a schematic perspective view of the component holding structure of FIG. 1 as seen from the bottom.
Figure 12:
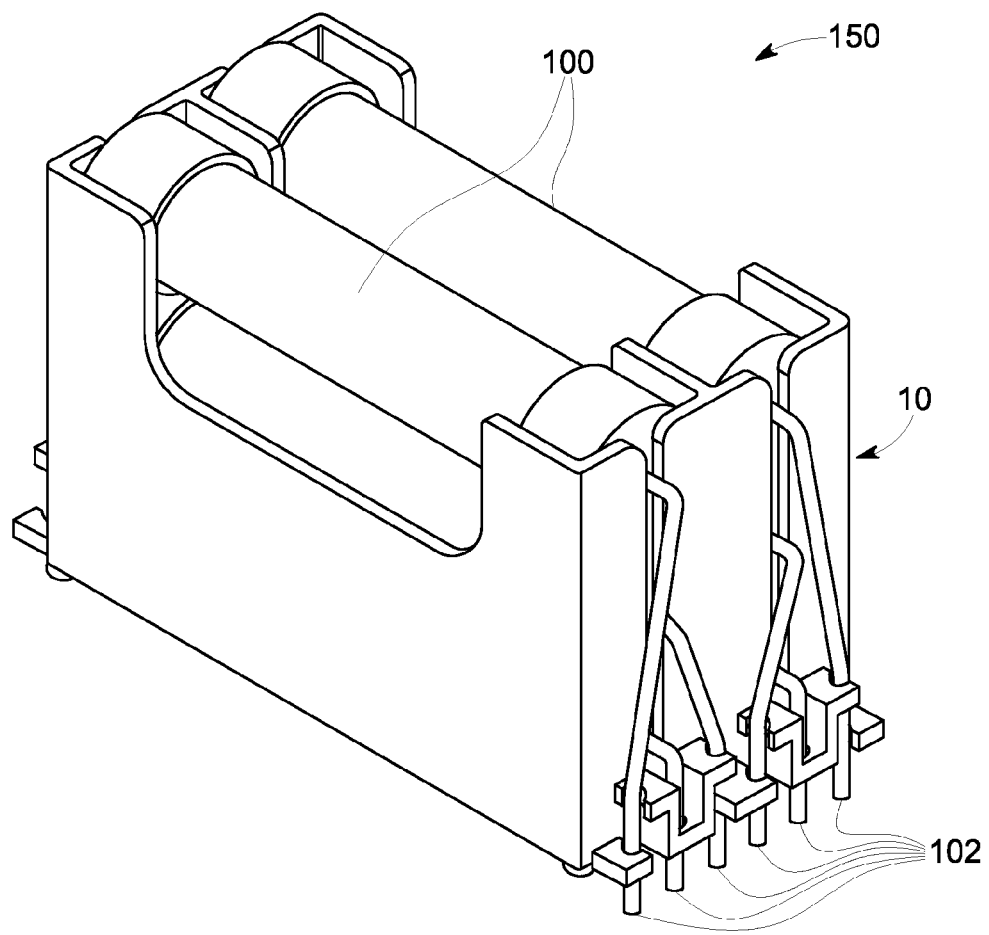
FIG. 12 is a schematic perspective view of a stacked axial component system using the component holding structure of FIG. 1 as seen from the top.
Figure 13:
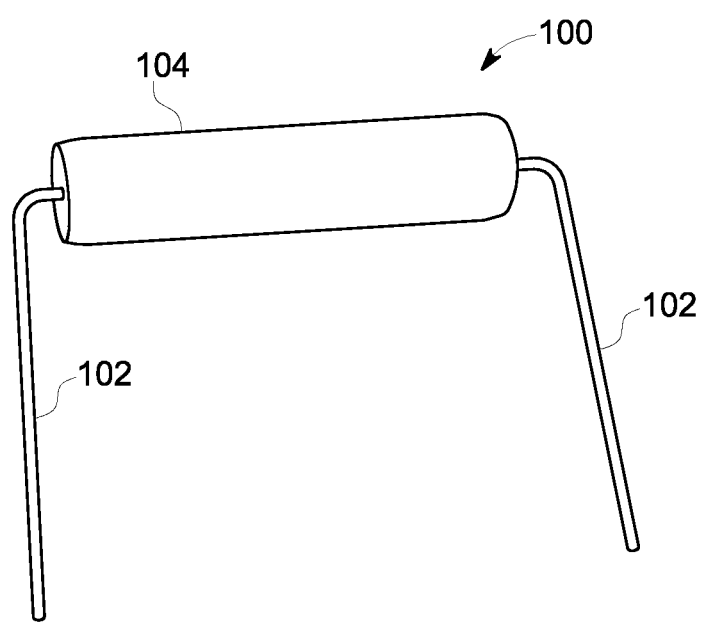
FIG. 13 is a schematic perspective view of an exemplary axial lead component.

FIG. 12 is a schematic perspective view of a stacked axial component system 150 using axial lead components 100 of FIG. 13 and component holding structure 10 of FIG. 1. Exemplary component holding structure 10 allows the assembly of axial lead components 100 in a vertically-stacked configuration. Axial lead 102 of axial lead component 100 is aligned to a predetermined path of lead guides 32, i.e. lead slots 50, 52, 54, and 55, and holes 56, and 58. Axial lead component 100 is inserted into place in component holding structure 10. Subsequent axial lead components 100 are assembled in a similar manner until the stacked axial component system 150 is complete. Leads 102 of axial lead components 100 are trimmed to a desired length to facilitate soldering to a PCB.

Figure 14:
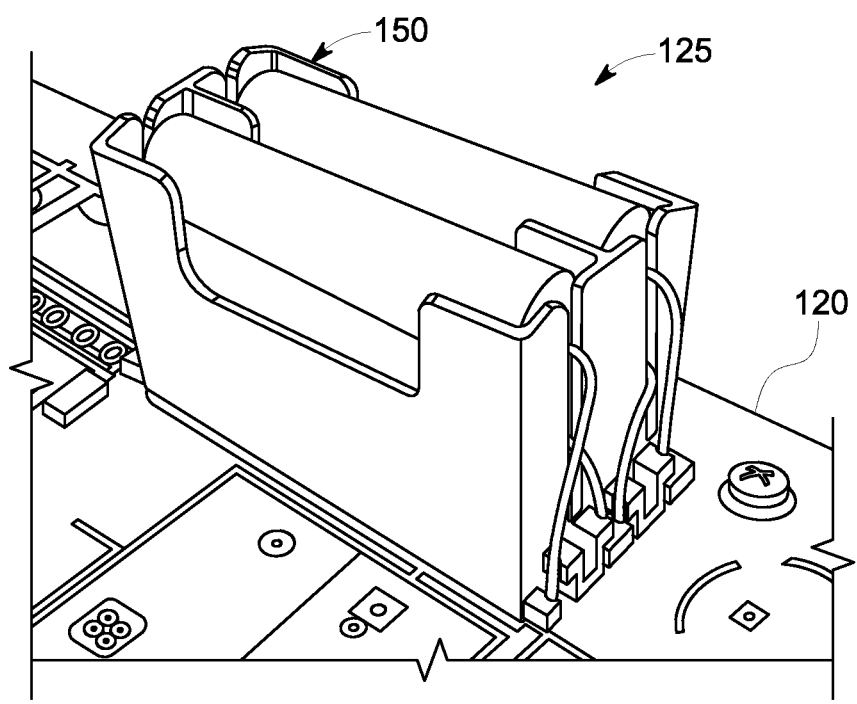
FIG. 14 is a schematic perspective view of the stacked axial component system of FIG. 12 shown attached to a printed wiring board.
Figure 15:
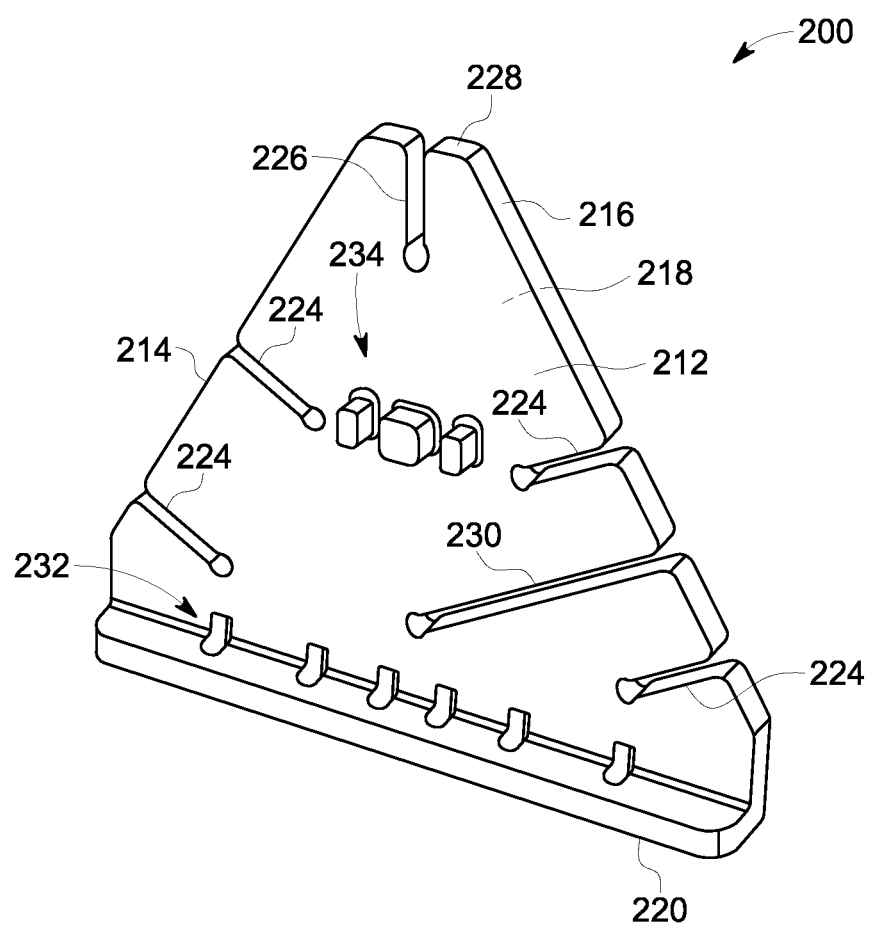
FIG. 15 is a schematic perspective view of an alternative component holding structure as seen from the top.

A power electronics system 125, as shown in FIG. 14, includes stacked axial component system 150 assembled onto a PCB 120 for soldering. Component holding structure 10 secures a body 104 of axial lead components 100 and holds leads 102 in a desired position for placement on PCB 120. This unique feature allows multiple axial lead components 100 to be placed in a single operation and allows for use of a wave solder process, rather than hand solder, which would be required if multiple axial lead components 100 were to be vertically-stacked individually. Furthermore, component holding structure 10 provides mechanical support to axial lead components 100, removing the need for secondary mechanical support, such as adhesives. As shown, the exemplary stacked axial component system 150 facilitates positioning six axial lead components 100 on PCB 120 is a space usually occupied by only two axial lead components 100. Thus stacked axial component system 150 facilitates efficient use of PCB 120 space.

Figure 16:
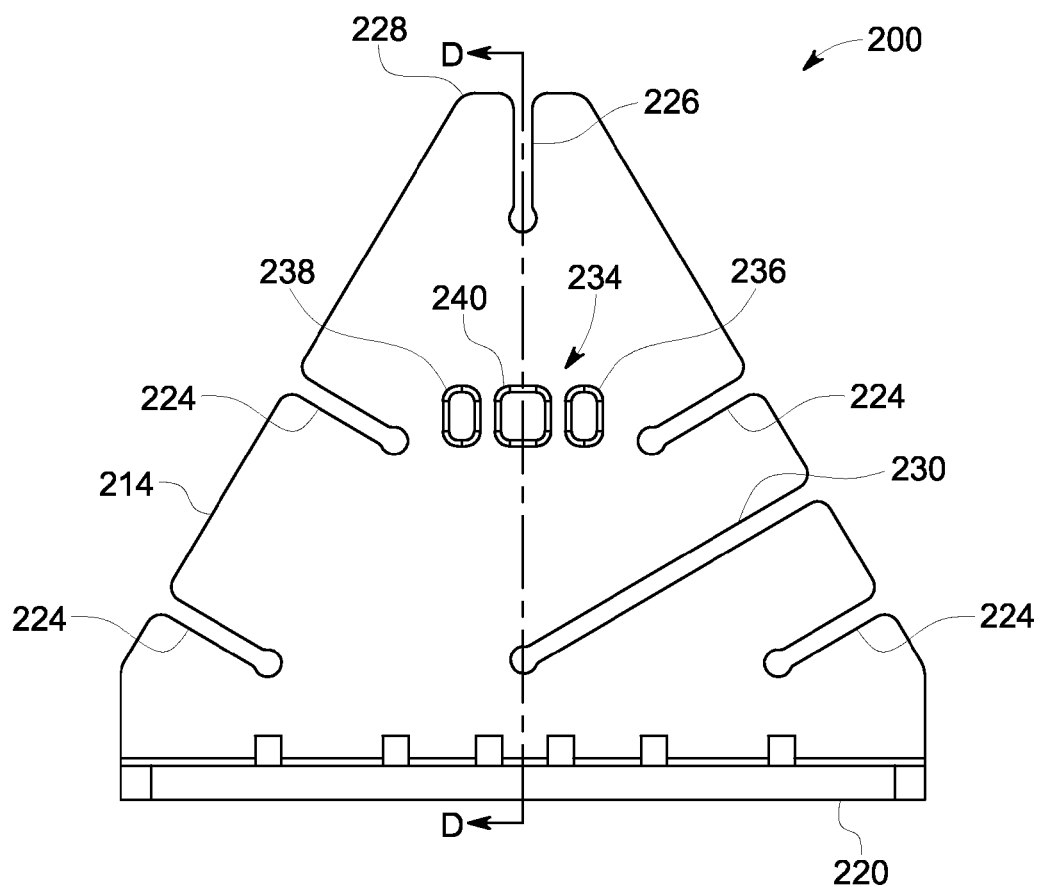
FIG. 16 is a front view of the component holding structure of FIG. 15.
Figure 17:
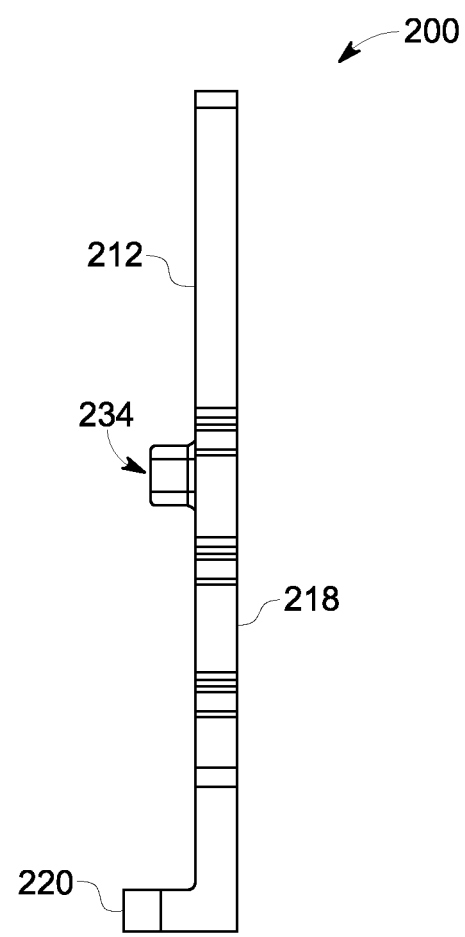
FIG. 17 is an end view of the component holding structure of FIG. 15.
Figure 18:
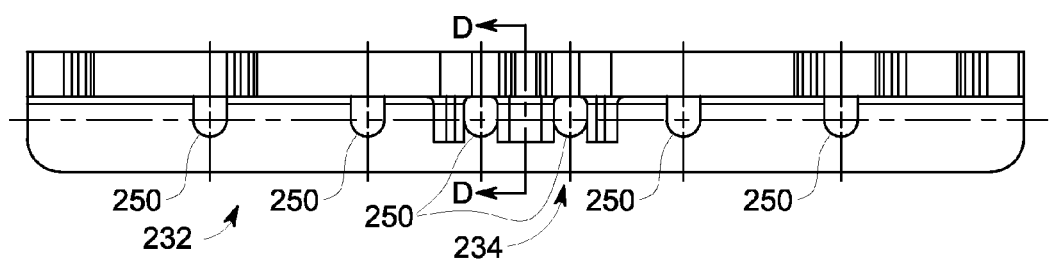
FIG. 18 is a top view of the component holding structure of FIG. 15.

In another suitable embodiment shown in FIGS. 15-18, a component holding structure 200 is configured to hold multiple axial lead components 100 or other such electronic components with axial leads. As shown in FIG. 16, component holding structure 200 is substantially symmetrical with respect to a vertical line D, which, when viewed from the front, is substantially centered on component holding structure 200. Alternatively, component holding structure 200 may include features and/or elements that are not symmetrical with respect to each other.

Component holding structure 200 is a molded component that is substantially tapered or triangular in shape. Component holding structure 200 is fabricated by injection molding a thermoplastic synthetic resin suitable for use as an insulator in electrical and electronic devices. Accordingly, the features of component holding structure 200 described herein may have a draft angle associated with a respective feature to promote removal of component holding structure 200 from a mold. Component holding structure 200 may be suitably fabricated from polybutylene terephthalate (PBT). In addition, component holding structure 200 may be fabricated from any material that permits component holding structure 200 to function as described herein. Furthermore, component holding structure 200 may be fabricated by methods other than molding, e.g., machining, and therefore may not have a draft angle associated with the features as described herein.

Component holding structure 200 is a tapered or triangular shaped structure that broadly includes a vertical wall with a front surface 212, a rear surface 218, a left side surface 214, and a right side surface 216. Right side surface 216 is substantially symmetric to left side surface 214 with respect to line D. Component holding structure 200 includes an integrally formed base 220 at the bottom of component holding structure. Base 220 extends forward, projecting from front surface 212. The terms top, bottom, front, rear, left, and right are used only for convenience to indicate relative positional relationships of features of component holding structure 200.

Each side surface 214 and 216 of component holding structure 200 includes elongate extending slots 224 formed therethrough. Slots 224 in left side surface 214 and slots 224 in right side surface 216 are provided in positions that are substantially symmetric to each other in relation to line D. Further, slots 224 on a respective side surface are spaced laterally apart along the respective side surface. Alternatively, slots 224 may not be symmetric to each other and may be of varying lengths with some slots 224 being longer than others. Slots 224 are open towards the top 228 of component holding structure 200 and extend downward a predetermined distance substantially perpendicular to a respective side surface. Component holding structure 200 also includes a slot 226 that is open to the top 228 and is substantially centered about line D. Slot 226 extends vertically down from top 228 and terminates at a location that is spaced above base 220. The width of slots 224 and 226 is configured such that a standard diameter lead 102 of axial lead component 100 can freely slide through slots 224 and 226. Slots 224 and 226 may have a width in the range of about 0.5 millimeters (mm) (0.020 inches (in.)) to about 1.0 mm (0.040 in). Alternatively, slots 224 and 226 may have any width that permits component holding structure 200 to function as described herein. Component holding structure 200 also includes an elongate slot 230 formed therethrough that is open towards the edge of right side surface 216 and is substantially parallel to slots 224 extending toward side surface 216. Slot 230 is configured to receive a lead 102 of axial lead component 100 and may have a width that is in the range of about 0.5 millimeters (mm) (0.020 inches (in.)) and about 1.0 mm (0.040 in). Alternatively, slot 230 can have any width that permits component holding structure 200 to function as described herein.

Component holding structure 200 includes lower lead guides 232 and upper lead guides 234 that are provided in positions that are substantially symmetric in reference to line D. Lead guides 234 include rectangular-shaped bosses 236 and 238, which are substantially symmetric to each other in reference to line D, and a boss 240, which is substantially centered about line D. Bosses 236, 238, and 240 are spaced laterally apart from and are generally in horizontal alignment with each other. Furthermore, bosses 236, 238, and 240 are spaced upward apart from base 220 but below slot 226. The bosses 236, 238, and 240 are configured to guide lead 102 of axial lead component 100 through lower lead guides 232. Alternatively, bosses 236, 238, and 240 may features such as notches or small lips (not shown) to facilitate holding lead 102 in place between bosses 236, 238, and 240.

Base 220 includes lower lead guides 232 comprising a plurality of substantially matching grooves 250 formed therethrough. Each groove 250 is closed to the front of component holding structure 200, terminated within base 220 at a circular-shaped closed end. Each groove 250 extends rearward through front surface 212. Each groove 250 extends upward a predetermined distanced spaced apart from base 220. The circular-shaped closed ends of each groove 250 are aligned along a line that is spaced apart from and parallel to front surface 212. Grooves 250 are configured to holds leads 102 in a desired position for placement on PCB 120.

Figure 19:
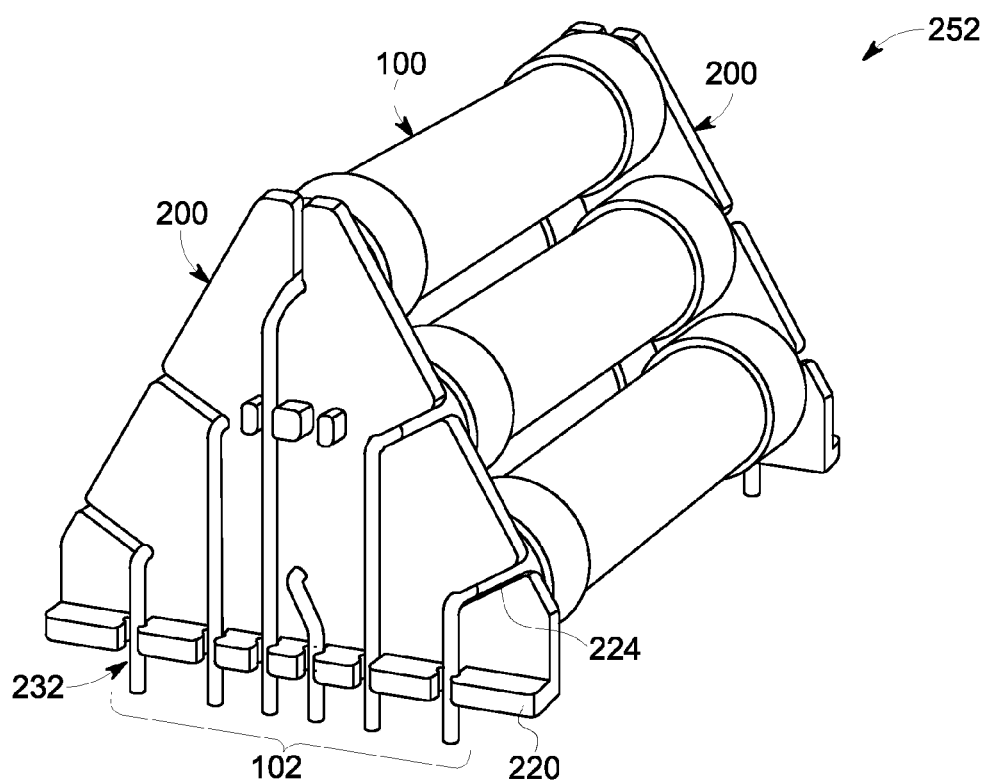
FIG. 19 is a schematic perspective view of a stacked axial component system using the component holding structure of FIG. 16 as seen from the top.

In use, component holding structures 200 allow the assembly of axial lead components 100 in a vertically-stacked configuration. FIG. 19 is a schematic perspective view of stacked axial component system 252 using the component holding structure of FIG. 16 as seen from the top. An axial lead 102 of axial lead component 100 is bent approximately 90 degrees downward and aligned with a groove 250 of lower lead guides 232. Axial lead 102 is positioned within one of slots 224 and 230. With respect to slot 226, axial lead 102 of axial lead component 100 is positioned within slot 226 and bent downward towards upper lead guides 234. Lead 102 is then aligned with both upper lead guide 234 and a respective groove 250 of lower lead guides 232. Subsequent axial lead components 100 are assembled in a similar manner. A second component holding structure 200 is coupled to the opposite end of the axial lead components 100 is substantially the same manner until stacked axial component system 252 is complete. Leads 102 of axial lead components 100 are trimmed to a desired length to facilitate soldering to PCB 120.

Figure 20:
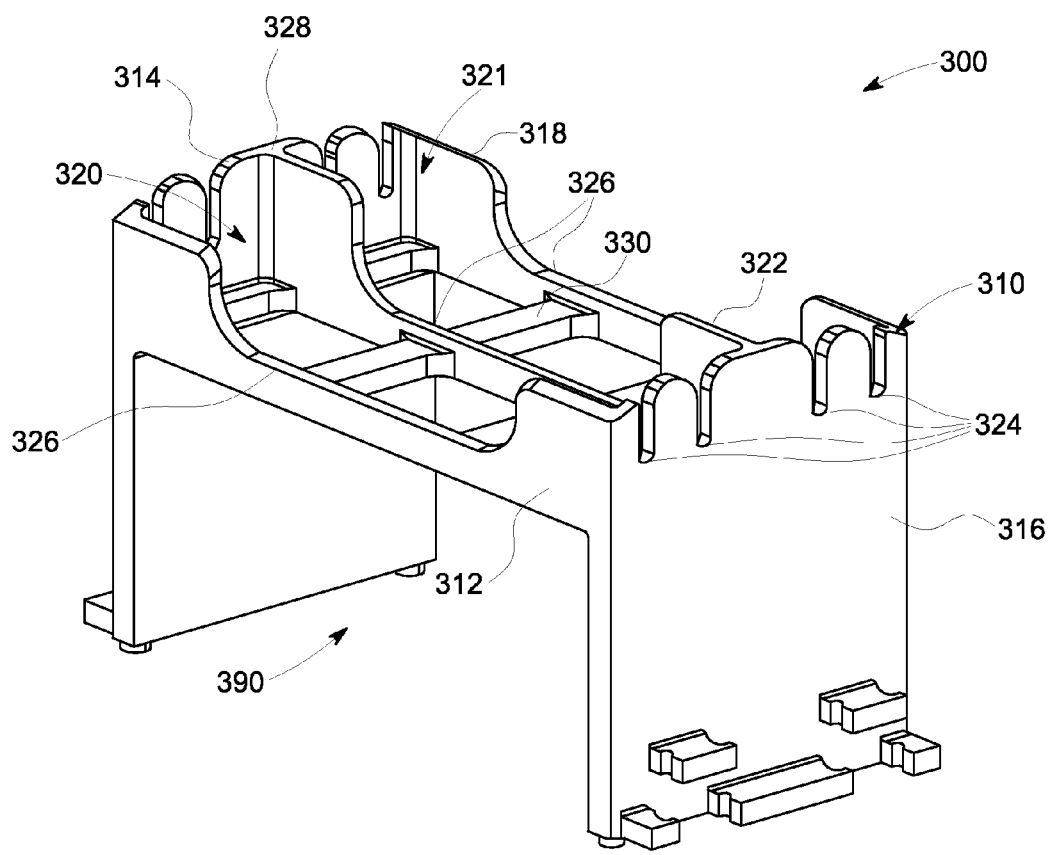
FIG. 20 is a schematic perspective view of an alternative component holding structure as seen from the top.
Figure 21:
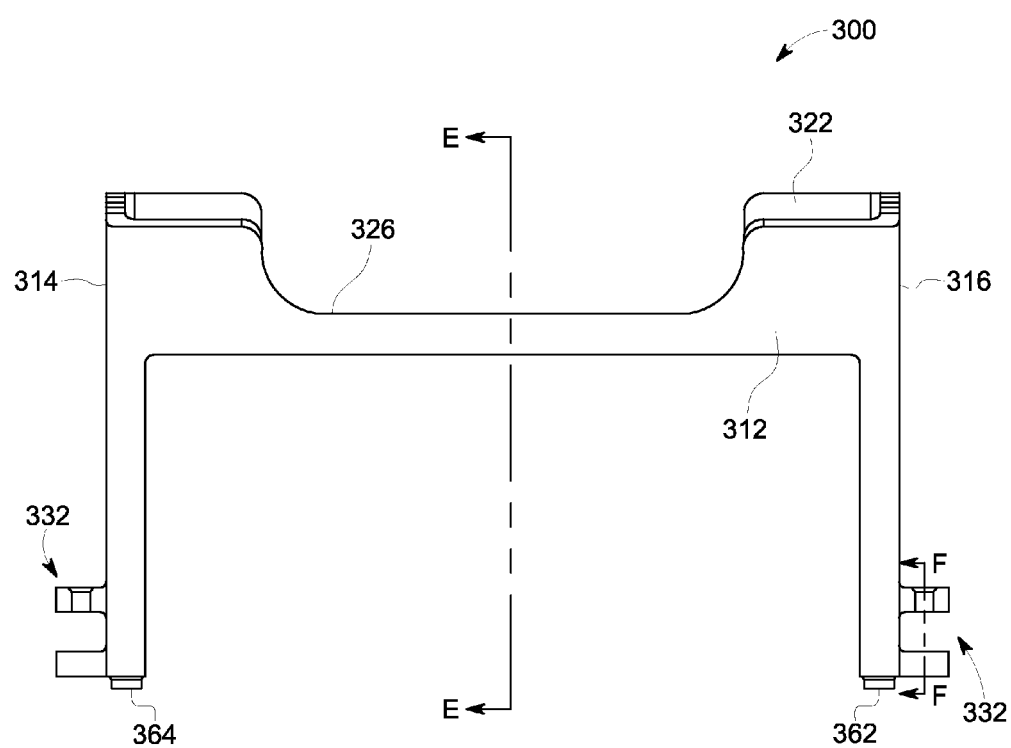
FIG. 21 is a front view of the component holding structure of FIG. 20.
Figure 22:
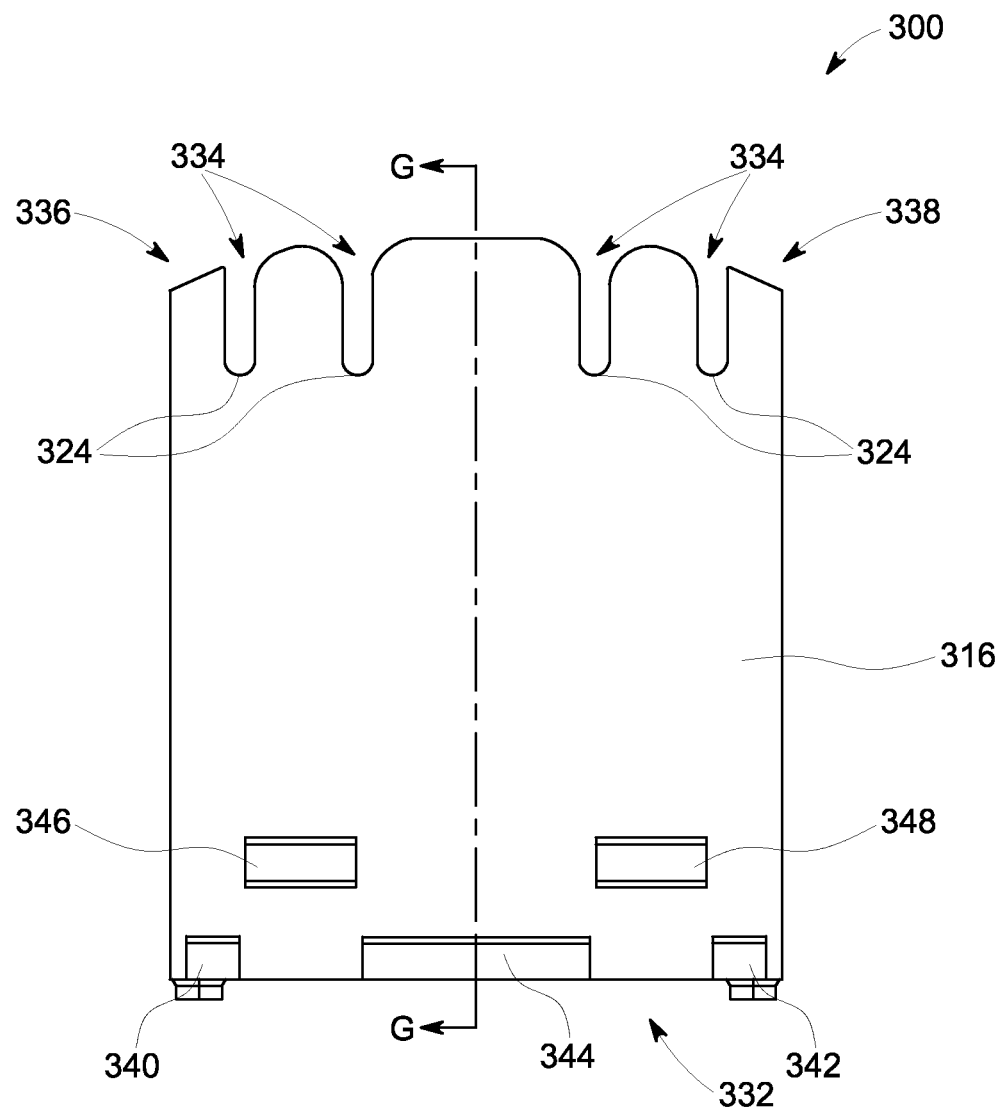
FIG. 22 is an end view of the component holding structure of FIG. 20.
Figure 23:
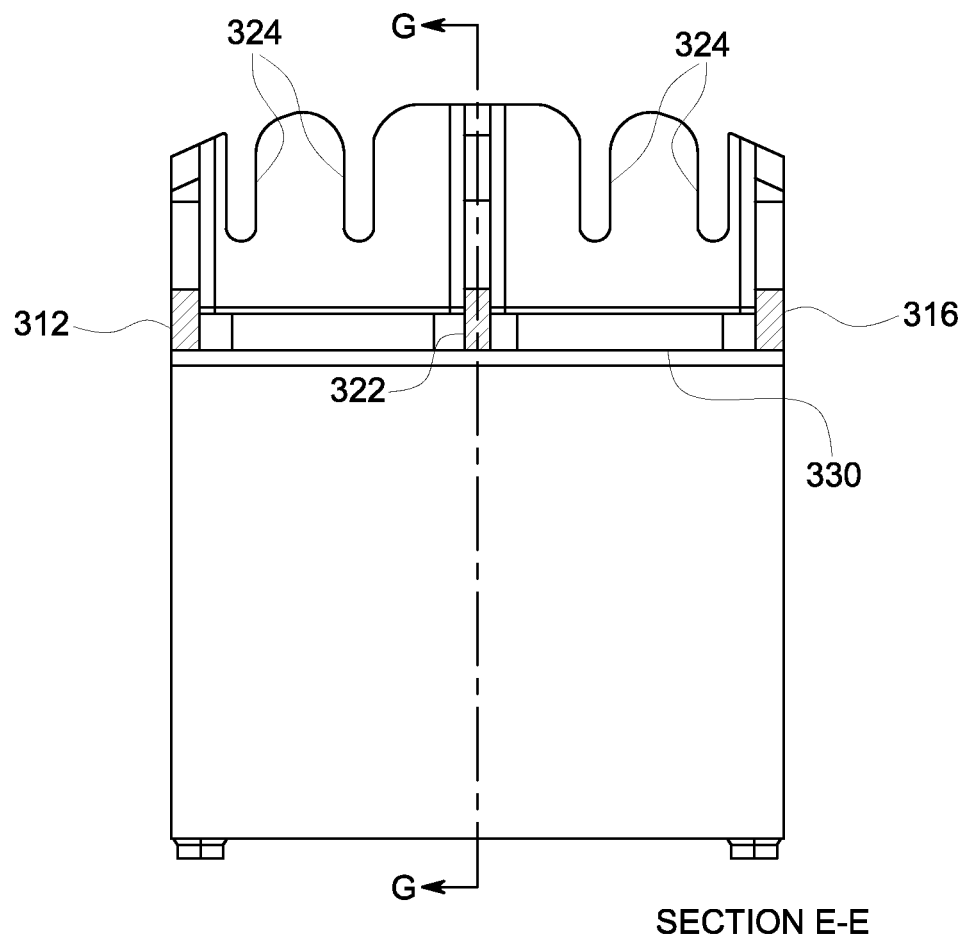
FIG. 23 is a cross section view of the component holding structure of FIG. 20 taken about line E.

In another suitable embodiment shown in FIGS. 20-25, an axial through-hole component holding structure 300 is configured to hold multiple axial lead components 100 or other such electronic components with axial leads. As shown in FIG. 21, the exemplary component holding structure 300 is substantially symmetrical with respect to a vertical line E, which, when viewed from the front, is substantially centered on component holding structure 300. In addition, as shown in FIG. 22, the exemplary component holding structure 300 is substantially symmetrical with respect to a vertical line G, which, when viewed from an end, is substantially centered on component holding structure 300. Alternatively, component holding structure 300 may include features and/or elements that are not symmetrical with respect to each other.

The exemplary component holding structure 300 is a molded container 310 that is substantially cuboid in shape. Accordingly, the features of component holding structure 300 described herein may have a draft angle associated with each wall and/or cavity to promote removal of component holding structure 300 from a mold. Component holding structure 300 is fabricated by injection molding a thermoplastic synthetic resin suitable for use as an insulator in electrical and electronic devices. In the exemplary embodiment, component holding structure 300 is fabricated from polybutylene terephthalate (PBT). However, component holding structure 300 may be fabricated from any non-conductive material that permits component holding structure 300 to function as described herein. Furthermore, component holding structure 300 may be fabricated by methods other than molding, e.g., machining, and therefore may not have a draft angle associated with the features as described herein.

Component holding structure 300 is a cuboid-shaped structure that broadly includes a front wall 312, a rear wall 318, a left end wall 314, and a right end wall 316. In the exemplary embodiment, component holding structure 300 also includes a center divider 322 substantially centered on line G and running substantially parallel to front wall 312 and rear wall 318. A front cavity 320, which is open to the top 328 and extends down to the bottom wall 330 of component holding structure 300, is formed by the inner sides of front wall 312, left end wall 314, right end wall 316, and bottom wall 330, and by the front side of divider 322. In the exemplary embodiment, component holding structure 300 includes a rear cavity 321 that is substantially symmetrical to front cavity 320 with respect to line G. Alternatively, component holding structure 300 may include any number of cavities and dividers that permit component holding structure 300 to function as described herein. The terms top, bottom, front, rear, left, and right are used only for convenience to indicate relative positional relationships.

Front wall 312, rear wall 318, and divider 322 include wide, vertically extending rectangular-shaped cutouts 326 formed therethrough. Cutouts 326 are open to the top 28 of component holding structure 300 and extend down a predetermined distance spaced apart from bottom wall 330. Cutouts 326 are generally centered on a respective wall in relation to line E, and extend widthwise between approximately 50% and 75% of the width of the respective wall. Alternatively, cutouts 326 may be of varying widths and depths that permit component holding structure 300 to function as described herein. Cutouts 326 facilitate the fabrication process by limiting the amount of material used during the molding process and facilitate the insertion and removal of axial lead components 100 from component holding structure 300.

As shown in FIGS. 19-24, each end wall 314 and 316 of component holding structure 300 includes elongate, vertically extending slots 324 formed therethrough. In the exemplary embodiment, slots 324 in left end wall 314 and slots 324 in right end wall 316 are provided in positions that are substantially symmetric to each other in relation to line E. Further, slots 324 on a respective end wall are spaced laterally apart and are provided in positions that are symmetric to each other in relation to line G. Alternatively, slots 324 may not be symmetric to each other and may be of varying lengths with some slots 324 being longer than others. In the exemplary embodiment, slots 324 are open at the top 328 of component holding structure 300 and extend down a predetermined distance spaced apart from bottom wall 330. The width of slots 324 is configured such that a standard diameter lead of axial lead component 100 can freely slide through slot 324. In the exemplary embodiment, slots 324 have a width in the range of about 0.5 millimeters (mm) (0.020 inches (in.)) to about 1.0 mm (0.040 in). Alternatively, slots 324 may have any width that permits component holding structure 300 to function as described herein.

In the exemplary embodiment, right end wall 316 and left end wall 314 are shaped to facilitate insertion of axial lead components 100 from component holding structure 300. Referring to FIG. 21, the open top of slots 324 taper outward, away from the slot, to create funnel-shaped openings 334. In addition, the front upper portion of right end wall 316 and left end wall 314 tapered downward between an edge of funnel-shaped openings 334 and front wall 312, defining a tapered area 336. In the exemplary embodiment, tapered area 336 is configured such that the edge of tapered area 336 is approximately equidistant from a point defined by the intersection of line G and the bottom edge of the respective end wall. In addition, the rear upper portion of right end wall 316 and left end wall 314 includes a tapered area 338 that is substantially symmetric to tapered area 336 in relation to line G. Alternatively, tapered areas 336 and 338 may be defined in any configuration that permits component holding structure 300 to function as described herein.

Figure 25:
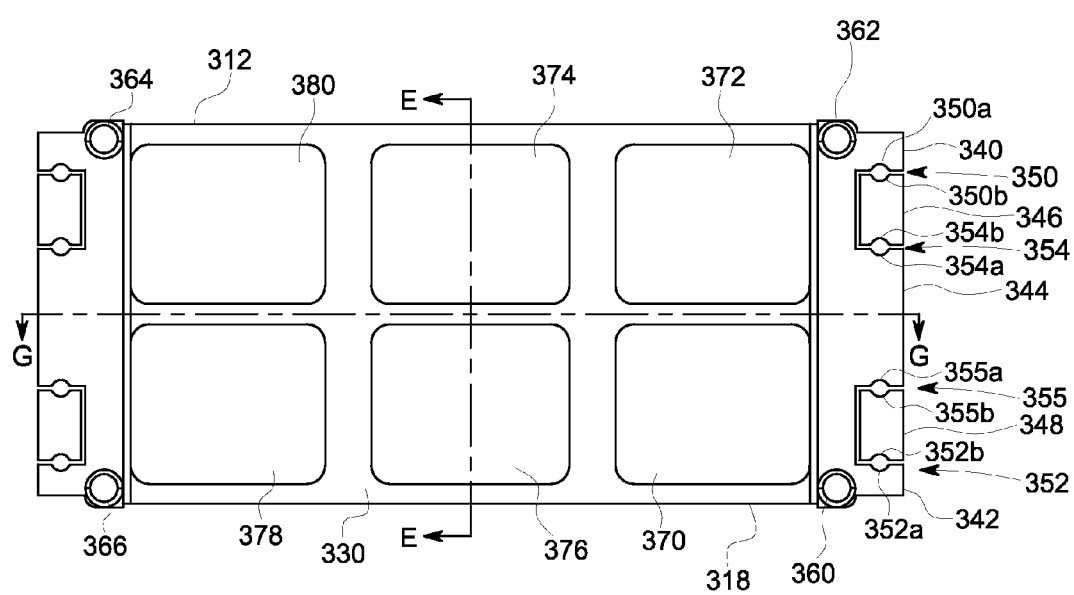
FIG. 25 is a bottom view of the component holding structure of FIG. 20.

Component holding structure 300 includes a plurality of lead guides 332 provided on right end wall 316 and left end wall 314 in positions that are substantially symmetric in reference to line E. Referring to FIG. 22, rectangular-shaped lower guides 340 and 342 are provided in positions that are substantially symmetric in reference to line G, and rectangular-shaped lower guide 344 is provided substantially centered on line G. Top surfaces of lower guides 340, 342, and 344 are spaced upward from a bottom edge of right end wall 316 a predetermined distance and are substantially coplanar with each other. Further, upper guides 346 and 348 are spaced laterally apart and are provided in positions that are symmetric to each other in relation to line G, generally being substantially centered between slots 324. With reference to FIG. 25, it is shown that lower guides 340, 342, and 344, and upper guides 346 and 348 are spaced laterally apart from each other such that they do not overlap when viewed from below, and that each guide extends substantially the same distance away from right end wall 316.

Lower guide 340 includes a semicircular groove 350a formed in its rear surface about a vertical axis. The top edge of semicircular groove 350a is tapered to facilitate guiding a lead 102 of axial lead component 100 into the groove. Lower guide 342 is substantially symmetric to lower guide 340 and thus includes a semicircular groove 352a formed in its front surface, also about a vertical axis. The top edge of semicircular groove 352a is tapered to facilitate guiding lead 102 of axial lead component 100 into the groove. Centered about line G is lower guide 344. Lower guide 344 includes a first semicircular groove 354a in its front surface and a second semicircular groove 355a in its rear surface. Both first and second semicircular grooves 354a and 355a are formed about a vertical axis.

Upper guide 346 is spaced apart upward from lower guides 340, 342, and 344. Upper guide 346 includes a semicircular groove 350b formed in its front surface about a vertical axis. The top edge of semicircular groove 350b is tapered to facilitate guiding lead 102 of axial lead component 100 into the groove. The vertical axis of semicircular groove 350b is collinear with the vertical axis of semicircular groove 350a of lower guide 340. As shown in FIG. 25, semicircular grooves 350a and 350b combine to define a lead slot 350 that is substantially circular when viewed from below. Upper guide 346 includes a semicircular groove 354b formed in its rear surface, also about a vertical axis. The top edge of semicircular groove 354b is tapered to facilitate guiding lead 102 of axial lead component 100 into the groove. The vertical axis of semicircular groove 354b is collinear with the vertical axis of semicircular groove 354a of lower guide 344. Thus, as shown in FIG. 25, semicircular grooves 354a and 354b combine to define a lead slot 354 that is substantially circular when viewed from below.

Upper guide 348 is provided in a position substantially symmetric to upper guide 346 with reference to line G. Upper guide 348 includes a semicircular groove 355b formed in its front surface about a vertical axis. The top edge of semicircular groove 355b is tapered to facilitate guiding lead 102 of axial lead component 100 into the groove. The vertical axis of semicircular groove 355b is collinear with the vertical axis of semicircular groove 355a of lower guide 344. As shown in FIG. 25, semicircular grooves 355a and 355b combine to define a lead slot 355 that is substantially circular when viewed from below. Upper guide 348 includes a semicircular groove 352b formed in its rear surface, also about a vertical axis. The top edge of semicircular groove 352b is tapered to facilitate guiding lead 102 of axial lead component 100 into the groove. The vertical axis of semicircular groove 352b is collinear with the vertical axis of semicircular groove 352a of lower guide 342. Thus, as shown in FIG. 25, semicircular grooves 352a and 352b combine to define a lead slot 352 that is substantially circular when viewed from below.

Figure 24:
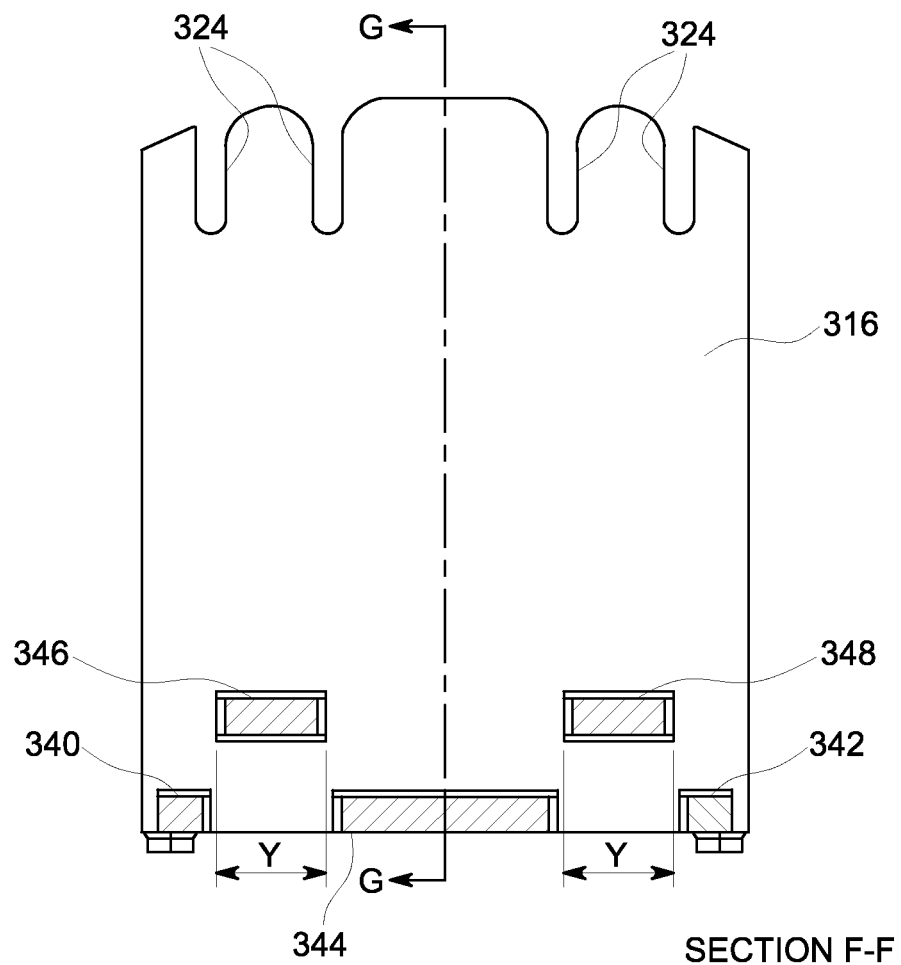
FIG. 24 is a cross section view of the component holding structure of FIG. 20 taken about section line F.

With reference to FIGS. 24 and 25, it is shown that the vertical axes of lead slots 350, 352, 354, and 355 are aligned along a path that is parallel to line E. Further, lead slots 350 and 354, and 352 and 355 are provided at a pitch Y and are provided in positions that are symmetric to each other in reference to line G.

In the exemplary embodiment, a plurality of bosses 360, 362, 364, and 366 are provided on component holding structure 300 and the bottom of end walls 314 and 316. The bosses 360, 362, 364, and 366 are provided in positions that are symmetric to each other in relation to lines E and G and are generally positioned at the outer corners of holding structure 300. Bottom wall 330 includes a plurality of cutouts. In the exemplary embodiment, six cutouts 370, 372, 374, 376, 378, and 380 are defined through bottom wall 330. Cutouts 372, 374, and 380 open to cavity 320, and cutouts 370, 376, and 378 open to cavity 321. Cutouts 372 and 380 are provided in positions that are symmetric to each other in relation to line E. Cutout 374 is provided substantially centered about line E and spaced inward from cutouts 372 and 380. The front edges of cutouts 372, 374, and 380 are defined by the inner surface of front wall 312, and the rear edges of cutouts 372, 374, and 380 are defined by the front surface of divider 322. Cutouts 370, 376, and 378 are provided in positions that are substantially symmetric to cutouts 372, 374, and 380, respectively, with reference to line G. Cutouts 370, 372, 374, 376, 378, and 380 facilitate the fabrication process by limiting the amount of material used during the molding process and facilitate the removal of axial lead components 100 from component holding structure 300. In alternative embodiments, component holding structure 300 may include any number and configuration of cutouts in bottom wall 330 that permits component holding structure 300 to function as described herein.

In the exemplary embodiment described in FIGS. 20-25, a bottom surface of bottom wall 330 is spaced apart a predetermined from the bottom edges of end walls 314 and 316. Front wall 312 and rear wall 318 extend upward from bottom wall 330 towards the open top 328 of component holding structure 300, thereby defining an open space 390 beneath bottom wall 330 and between end walls 314 and 316. Open space 390 facilitates efficient use of printed circuit board (PCB) space by permitting surface mount components and/or small through-hole components to be placed beneath component holding structure 300.

Figure 26:
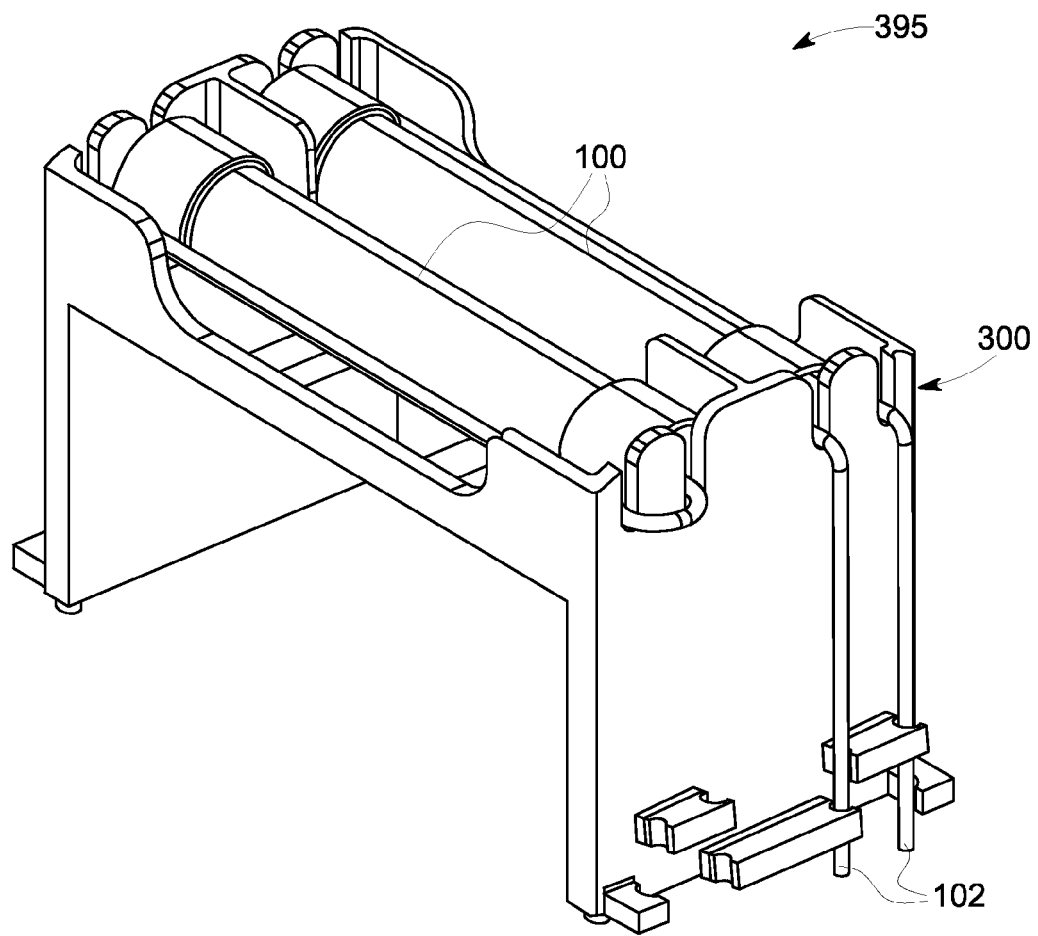
FIG. 26 is a schematic perspective view of an axial component system using the component holding structure of FIG. 19 as seen from the top.

FIG. 26 is a schematic perspective view of an alternative axial component system 395 using axial lead components 100 of FIG. 13 and component holding structure 300 of FIG. 20. Component holding structure 300 allows the assembly of axial lead components 100 in a side-by-side configuration. Some axial lead components 100 may be too tall for the allowed vertical envelope of a PCB, so they may be placed on the PCB horizontally. This occupies significant PCB space and wastes vertical space above axial lead components 100. At least one drawback to lifting axial lead components 100 off the PCB is that a large lead loop area is created when the leads are dropped directly to the PCB, thereby increasing susceptibility to magnetic fields.

Figure 27:
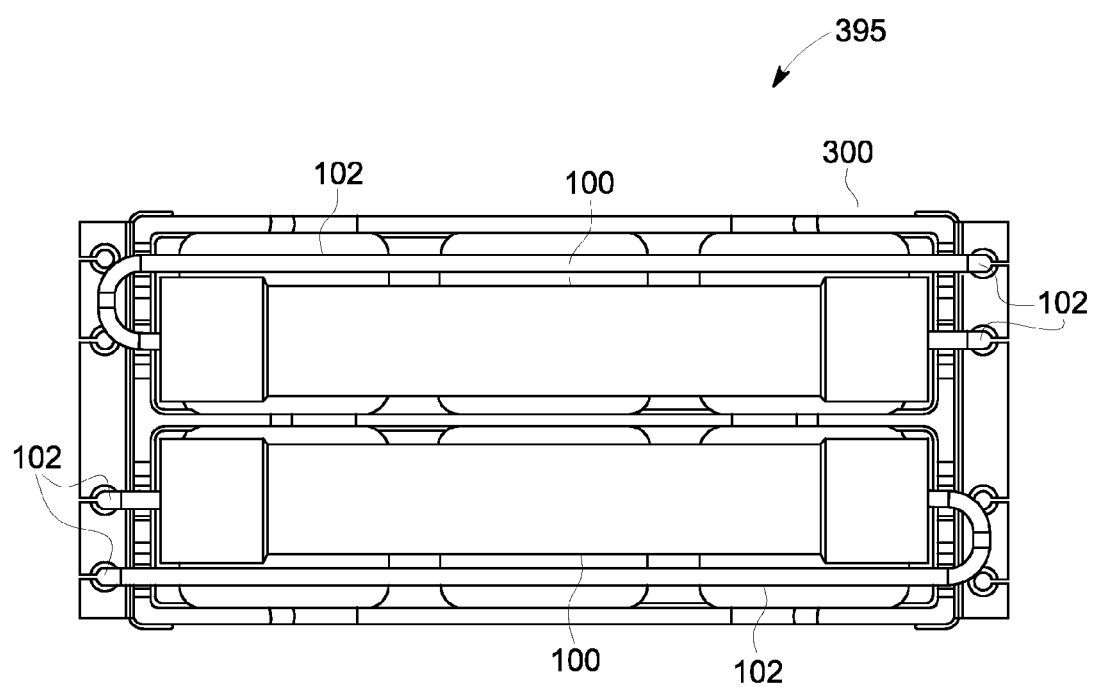
FIG. 27 is a top view schematic drawing showing the axial component lead configuration of the axial component system of FIG. 25.

FIG. 27 is a top view schematic drawing showing axial component lead 102 configuration of axial component system 395 of FIG. 26. Axial component system 395 allows axial lead components 100 to be installed in a horizontal orientation above the PCB surface, leaving valuable PCB surface space for other components, e.g., relays, capacitors, inductors, or the like. With reference to FIGS. 26 and 27, one of axial leads 102 of axial lead component 100 is directed back along the body of axial lead component 100 such that both axial leads 102 of axial lead component 100 extend from one end of axial lead component 100. Axial leads 102 are aligned with slots 324 and further slid into a predetermined path of lead guides 332 on one of end walls 312 and 314. This decreased loop area reduces the susceptibility to internal magnetic fields. This configuration also allows two axial lead components 100 to be placed contrary to each other, helping to cancel any generated magnetic fields in the axial leads 102.

Figure 28:
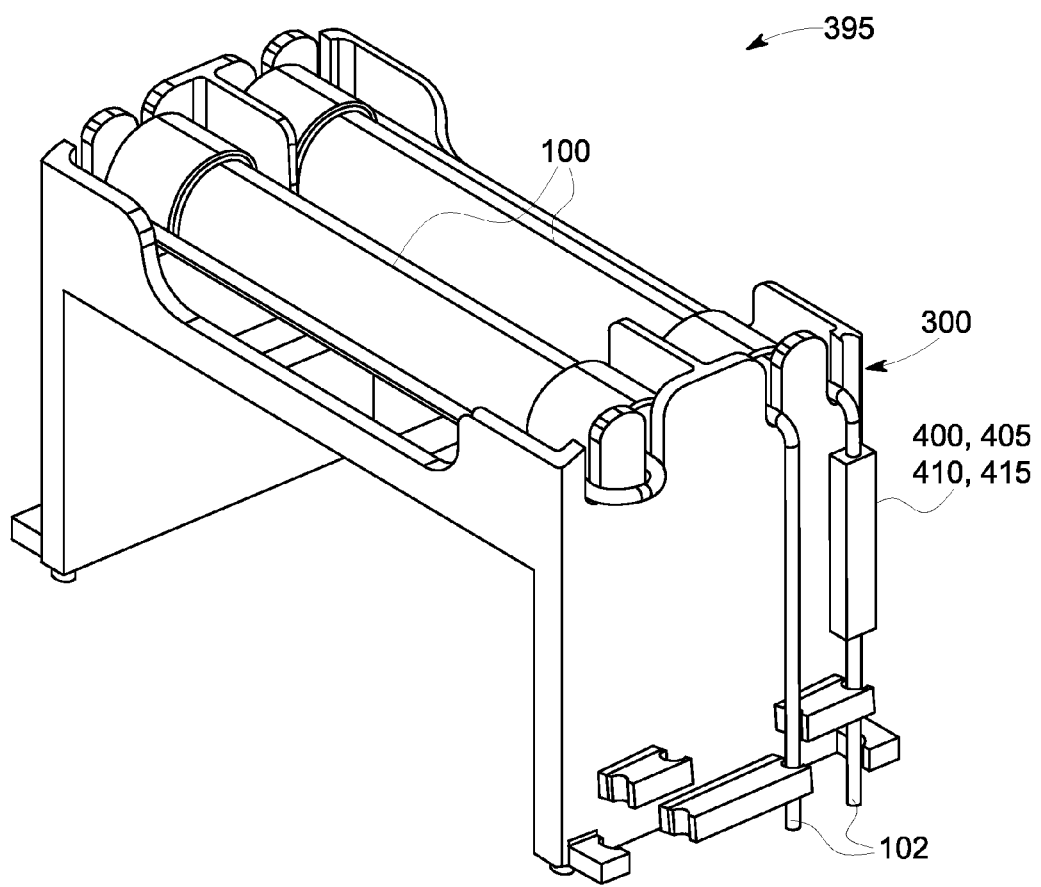
FIG. 28 is a schematic perspective view of an axial component system including a choke mechanism using the component holding structure of FIG. 19 as seen from the top.

FIGS. 28-32 show embodiments of electrical choke mechanisms that may be integrated into axial component system 150 and axial component system 395. Axial component system 150 and 395 may include one or more of the choke mechanisms described herein. FIG. 28 is a schematic perspective view of an axial component system including a choke mechanism 400, 405, 410, and 415 using the component holding structure of FIG. 19. As described above with reference to FIGS. 26 and 27, at least one drawback to lifting axial lead components 100 off the PCB is that a large lead loop area is created when the leads are dropped directly to the PCB. The large loop area may increase the susceptibility of axial component system 150 and 395 to magnetic fields or electromagnetic interference (EMI). Generally, the electrical choke mechanism 400, 405, 410, and 415 include a magnetic core with axial lead 102 running through or wound around the magnetic core. Optionally or alternatively, choke mechanism 400, 405, 410, and 415 may include at least one of a resistor, capacitor, inductor, and a filter element. Choke mechanism 400, 405, 410, and 415 facilitate inhibiting the susceptibility of axial component system 150 and 395 to EMI.

Figure 29:
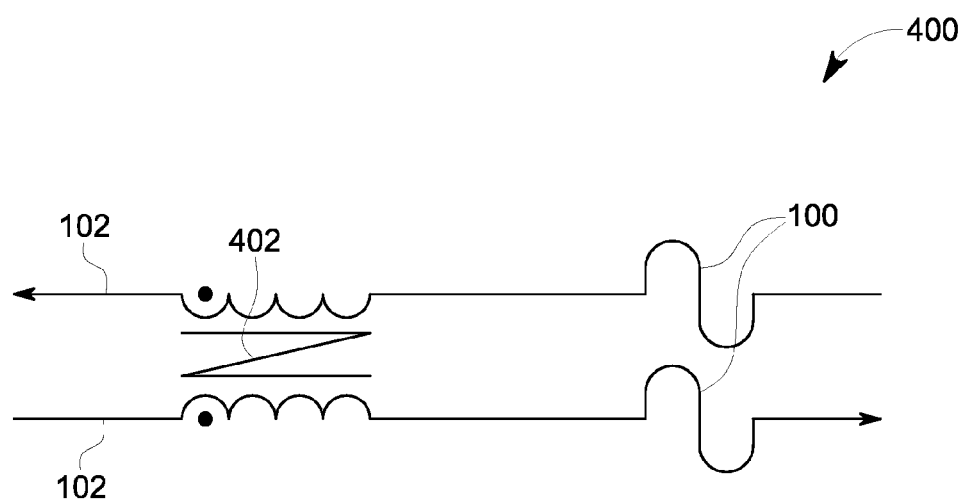
FIG. 29 is a schematic drawing of an exemplary common-mode choke that may be used with the axial component system shown in FIG. 12 and axial component system shown in FIG. 28.

FIG. 29 is a schematic drawing of an exemplary common-mode choke 400 that may be used with axial component system 150 shown in FIG. 12 and axial component system 395 shown in FIG. 28. Choke 400 includes a common magnetic core 402 that may be integrated into axial component system 150 and 395. Alternatively, core 402 may be located in open space 90 and 390 beneath bottom wall 30 and 330 respectively, with a respective axial lead 102 of a respective axial lead component 100 running through or being wound around common core 402.

Figure 30:
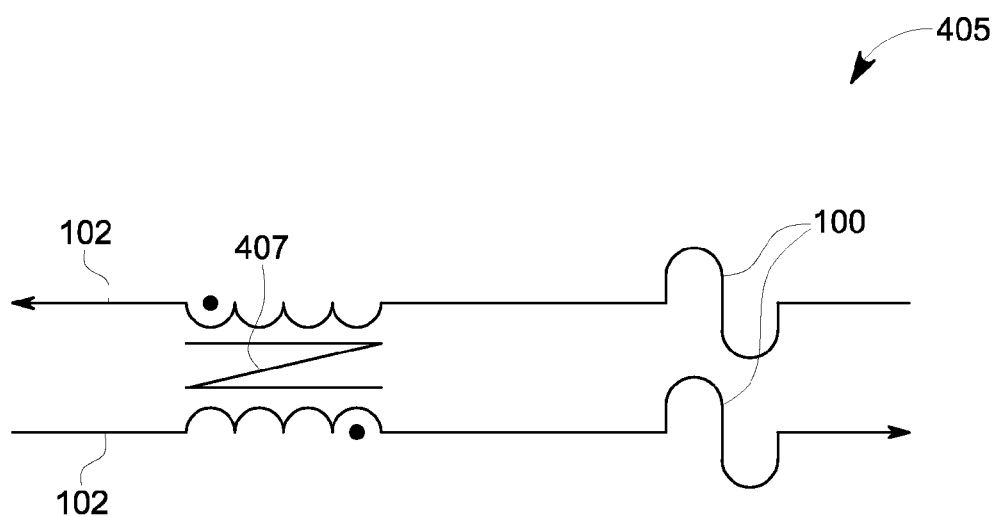
FIG. 30 is a schematic drawing of an exemplary differential-mode choke that may be used with axial component system shown in FIG. 12 and axial component system shown in FIG. 28.

FIG. 30 is a schematic drawing of an exemplary differential-mode choke 405 that may be used with axial component system 150 shown in FIG. 12 and axial component system 395 shown in FIG. 28. Choke 405 includes a common core 407 that may be integrated into axial component system 150 and 395. In the exemplary embodiment, core 407 is a distributed gap core, for example, without limitation, a core fabricated from a ferromagnetic powder held together with non-magnetic binder. Alternatively, core 407 may be any type of magnetic core that permits choke 405 to operate as described herein. In an alternative embodiment, core 407 may be located in open space 90 and 390 beneath bottom wall 30 and 330 respectively, with a respective axial lead 102 of a respective axial lead component 100 running through or being wound around common core 407.

Figure 31:
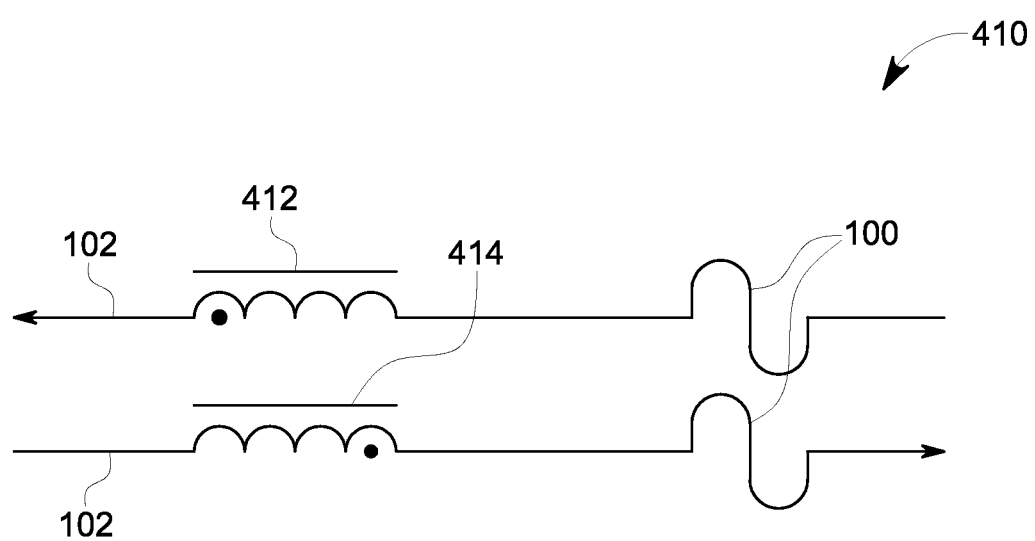
FIG. 31 is a schematic drawing of an alternative exemplary differential-mode choke that may be used with axial component system shown in FIG. 12 and axial component system shown in FIG. 28.

FIG. 31 is a schematic drawing of an alternative exemplary differential-mode choke 410 that may be used with axial component system 150 shown in FIG. 12 and axial component system 395 shown in FIG. 28. Choke 410 includes independent non-coupled cores 412 and 414. Each of cores 412 and 414 may be integrated into axial component system 150 and 395. Alternatively, cores 412 and 414 may be located in open space 90 and 390 beneath bottom wall 30 and 330 respectively, with axial lead 102 of a respective axial lead component 100 running through or being wound around core 412 and 414, respectively.

Figure 32:
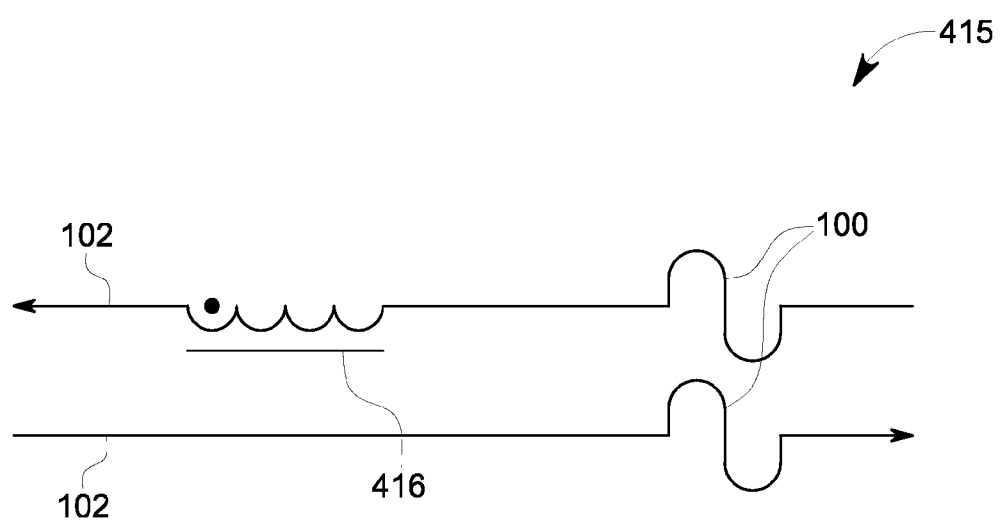
FIG. 32 is a schematic drawing of an alternative exemplary differential-mode choke that may be used with axial component system shown in FIG. 12 and axial component system shown in FIG. 28.

FIG. 32 is a schematic drawing of an alternative exemplary differential-mode choke 415 that may be used with axial component system 150 shown in FIG. 12 and axial component system 395 shown in FIG. 28. Choke 415 includes a core 416 that may be integrated into axial component system 150 and 395. Core 416 may be any type of magnetic core that permits choke 415 to operate as described herein. Alternatively, core 416 may be located in open space 90 and 390 beneath bottom wall 30 and 330 respectively, with axial lead 102 of axial lead component 100 running through or being wound around core 416.

Exemplary embodiments of through-hole component holding structures are described above in detail. The apparatus and systems are not limited to the specific embodiments described herein, but rather, operations of the methods and components of the systems may be utilized independently and separately from other operations or components described herein. For example, the systems and apparatus described herein may have other industrial or consumer applications and are not limited to practice with electronic components as described herein. Rather, one or more embodiments may be implemented and utilized in connection with other industries.

Although specific features of various embodiments of the disclosure may be shown in some drawings and not in others, this is for convenience only. In accordance with the principles of the disclosure, any feature of a drawing may be referenced or claimed in combination with any feature of any other drawing.

As used herein, an element or step recited in the singular and preceded with the word "a," "an," or "the" should be understood as not excluding plural said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Approximating language, as used in the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. In the specification and the claims, range limitations may be combined or interchanged; such ranges are identified and include all the subranges contained therein unless context or language indicates otherwise.

This written description uses examples to describe the disclosure, including the best mode, and to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A component holding structure comprising:
a pair of opposing end walls defining at least one cavity therebetween, the at least one cavity configured to receive a plurality of through-hole components therein such that the plurality of through-hole components are positioned between said pair of opposing end walls in a vertically-stacked configuration, each through-hole component having an axial lead, each end wall comprising:
at least one slot defined therethrough, said at least one slot configured to receive the axial lead of each through-hole component when the plurality of through-hole components are inserted into said component holding structure; and
a plurality of lead guides configured to guide the axial lead of each through-hole component when the plurality of through-hole components are inserted into said component holding structure, wherein said plurality of lead guides comprise a plurality of lower lead guides and a plurality of upper lead guides spaced vertically from said plurality of lower lead guides.

2. The component holding structure in accordance with claim 1, wherein, said plurality of upper lead guides configured to maintain a predetermined spaced distance between the axial lead of one through-hole component apart from the axial lead of another through-hole component.

3. The component holding structure in accordance with claim 1, wherein each lower lead guide of said plurality of lower lead guides comprises a groove configured to receive the axial lead of a respective one of the plurality of through-hole components.

4. The component holding structure in accordance with claim 1, wherein said at least one slot comprises an opening at a top edge of said each end wall.

5. The component holding structure in accordance with claim 4, wherein said opening of said at least one slot is tapered outward, away from said at least one slot, forming a funnel-shaped opening for receiving the axial lead of each through-hole component.

6. The component holding structure in accordance with claim 5, wherein said top edge of said each end wall comprises a tapered portion extending downward from at least one edge of said funnel-shaped opening, said tapered portion configured to facilitate inserting the plurality of through-hole components into said component holding structure.

7. The component holding structure in accordance with claim 1, wherein said each end wall further comprises at least one barrier fin configured to space the axial lead of one through-hole component apart from the axial lead of another through-hole component when the plurality of through-hole components are inserted into said component holding structure.

8. The component holding structure in accordance with claim 7, wherein the at least one barrier fin extends upward from a respective one of said plurality of lead guides.

9. The component holding structure in accordance with claim 1, further comprising a bottom wall, said bottom wall extending between said pair of opposing end walls, wherein said bottom wall at least partially defines the at least one cavity.

10. The component holding structure in accordance with claim 9, further comprising a front wall and a rear wall extending upwardly from said bottom wall, said front wall and said rear wall at least partially defining the at least one cavity.

11. The component holding structure in accordance with claim 10, wherein said front wall and said rear wall have at least one slot defined through said front wall and said rear wall respectively.

12. A power electronics system comprising:
a printed circuit board;
a plurality of through-hole components, each through-hole component comprising an axial lead; and a component holding structure coupled to said printed circuit board and comprising:
  a pair of opposing end walls defining at least one cavity therebetween, wherein said plurality of through-hole components are positioned between said pair of opposing end walls in a vertically-stacked configuration, each end wall comprising:
    at least one slot defined therethrough, said at least one slot configured to receive said axial lead of each through-hole component; and
    a plurality of lead guides configured to receive and guide said axial lead of each through-hole component towards said printed circuit board, wherein said plurality of lead guides comprise a plurality of lower lead guides and a plurality of upper lead guides spaced vertically from said plurality of lower lead guides.

13. The power electronics system in accordance with claim 12, Wherein said at least one slot comprises an opening at a top edge of said each end wall, said opening tapered outward away from said at least one slot and forming a funnel-shaped opening configured to receive said axial lead of said each through-hole component.

14. The power electronics system in accordance with claim 12, further comprising at least one electrical choke mechanism.

15. The power electronics system in accordance with claim 14, wherein said at least one electrical choke mechanism comprises one or more of the following: a common-mode choke, a differential-mode choke, a differential-mode choke having a distributed gap core, and a differential-mode choke having independent non-coupled cores.

16. The power electronics system in accordance with claim 14, wherein said at least one electrical choke mechanism comprises one or more of the following: a resistor, a capacitor, an inductor, and a filter element.

17. The power electronics system in accordance with claim 12, wherein said plurality of upper lead guides configured to maintain a predetermined spaced distance between the axial lead of one through-hole component apart from the axial lead of another through-hole component.

18. The power electronics system in accordance with claim 12, wherein said each end wall further comprises at least one barrier fin configured to space the axial lead of one through-hole component apart from the axial lead of another through-hole component when the plurality of through-hole components are inserted into said component holding structure.

19. A method of assembling a power electronics system, said method comprising:
  providing a component holding structure including a pair of opposing end walls defining at least one cavity therebetween, each end wall including at least one slot defined therethrough and a plurality of lead guides;
  inserting a plurality of through-hole components having an axial lead into the component holding structure such that the plurality of through-hole components are positioned in a vertically-stacked configuration;
  inserting the axial leads into the at least one slot;
  guiding the axial leads using the plurality of lead guides, wherein guiding the axial leads including guiding the axial leads using at least one of a plurality of lower lead guides and a plurality of upper lead guides spaced vertically from said plurality of lower lead guides;
  trimming the axial leads to a desired length; and
  coupling the component holding structure to a printed circuit board by soldering the axial leads to the printed circuit board.

20. The method in accordance with claim 19, further comprising electrically coupling at least one electrical choke mechanism to the axial lead of the axial lead component.

* * * * *